(12) United States Patent
Lin et al.

(10) Patent No.: US 11,107,904 B2
(45) Date of Patent: Aug. 31, 2021

(54) INNER SPACER FORMATION IN MULTI-GATE TRANSISTORS

(71) Applicant: Taiwan Semiconductor Manufacturing Co., Ltd., Hsin-Chu (TW)

(72) Inventors: Han-Yu Lin, Nantou County (TW); Chansyun David Yang, Shinchu (TW); Tze-Chung Lin, Hsinchu (TW); Fang-Wei Lee, Hsinchu (TW); Fo-Ju Lin, Keelung (TW); Li-Te Lin, Hsinchu (TW); Pinyen Lin, Rochester, NY (US)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/592,281

(22) Filed: Oct. 3, 2019

(65) Prior Publication Data

US 2020/0127119 A1 Apr. 23, 2020

Related U.S. Application Data

(60) Provisional application No. 62/749,491, filed on Oct. 23, 2018.

(51) Int. Cl.
| | |
|---|---|
| H01L 29/66 | (2006.01) |
| H01L 29/78 | (2006.01) |
| H01L 21/311 | (2006.01) |
| H01L 29/06 | (2006.01) |

(52) U.S. Cl.
CPC .. *H01L 29/66553* (2013.01); *H01L 21/31116* (2013.01); *H01L 29/0649* (2013.01); *H01L 29/6681* (2013.01); *H01L 29/66545* (2013.01); *H01L 29/66818* (2013.01); *H01L 29/7853* (2013.01)

(58) Field of Classification Search
CPC .......... H01L 29/66553; H01L 29/7853; H01L 29/66545; H01L 29/6681; H01L 29/66818; H01L 29/0649; H01L 21/31116
See application file for complete search history.

(56) References Cited

U.S. PATENT DOCUMENTS

| | | | |
|---|---|---|---|
| 5,397,431 A * | 3/1995 | Kadomura | H01L 21/31116 216/37 |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |

(Continued)

*Primary Examiner* — Tuan A Hoang
(74) *Attorney, Agent, or Firm* — Haynes and Boone, LLP

(57) ABSTRACT

A method of fabricating a semiconductor device includes forming a structure including multiple nanowires vertically stacked above a substrate; depositing a dielectric material layer wrapping around the nanowires; performing a treatment process to a surface portion of the dielectric material layer; selectively etching the surface portion of the dielectric material layer; repeating the steps of performing the treatment process and selectively etching until the nanowires are partially exposed; and forming a gate structure engaging the nanowires.

20 Claims, 20 Drawing Sheets

(56) References Cited

U.S. PATENT DOCUMENTS

| | | |
|---|---|---|
| 9,520,482 B1 | 12/2016 | Chang et al. |
| 9,548,303 B2 | 1/2017 | Lee et al. |
| 9,576,814 B2 | 2/2017 | Wu et al. |
| 2003/0194874 A1* | 10/2003 | Ouchi ............... H01L 21/32139 438/710 |
| 2013/0285116 A1 | 10/2013 | Lochtefeld et al. |
| 2014/0001441 A1* | 1/2014 | Kim ................. H01L 29/66553 257/29 |
| 2016/0027929 A1* | 1/2016 | Cheng .............. H01L 29/78696 257/9 |
| 2016/0111544 A1* | 4/2016 | Cheng ............. H01L 21/823431 257/192 |
| 2018/0226490 A1* | 8/2018 | Le ....................... H01L 21/0217 |
| 2019/0393350 A1* | 12/2019 | Thompson .......... H01L 29/7855 |
| 2020/0152767 A1* | 5/2020 | Armstrong ........ H01L 29/66439 |

\* cited by examiner

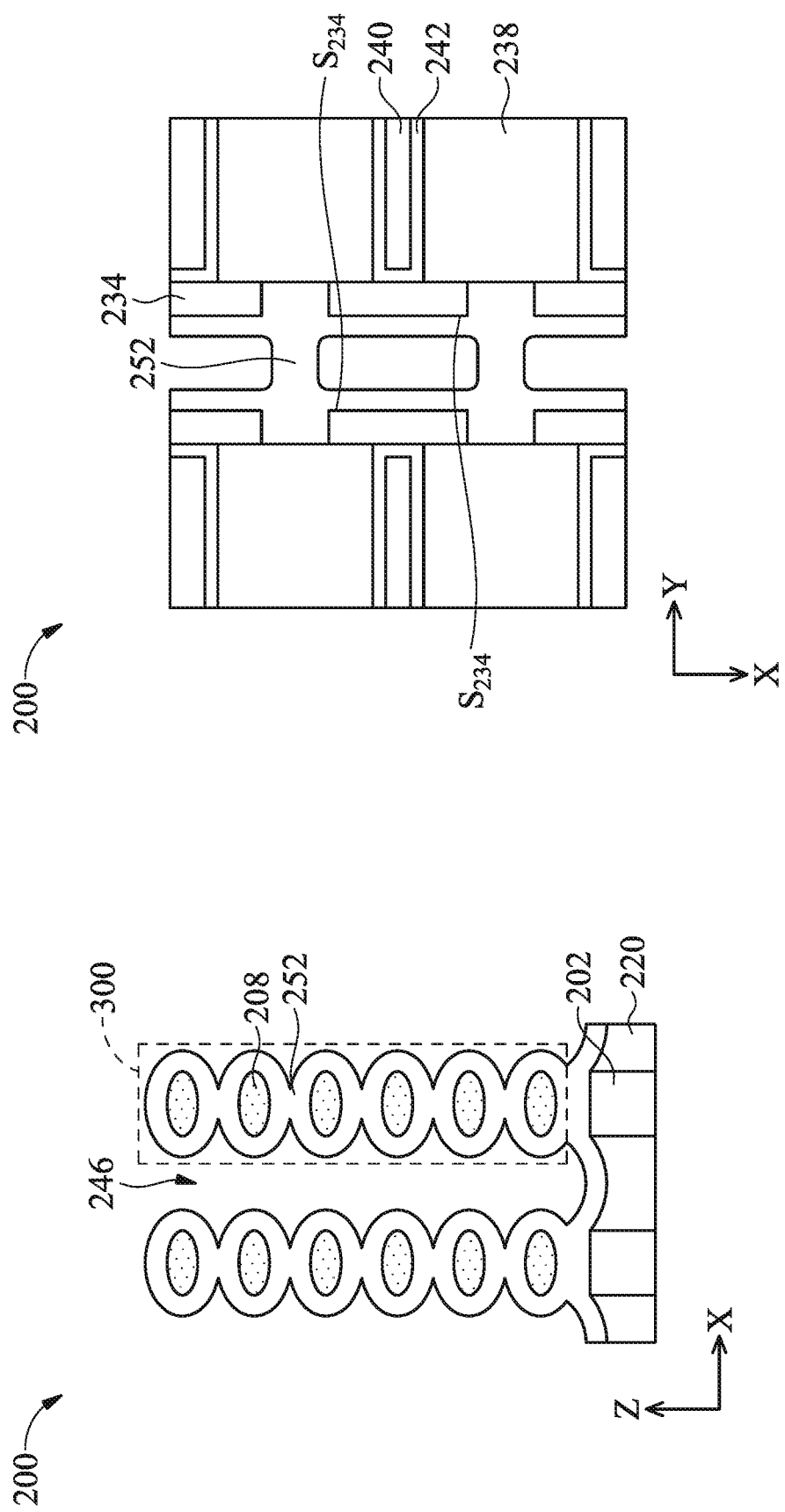

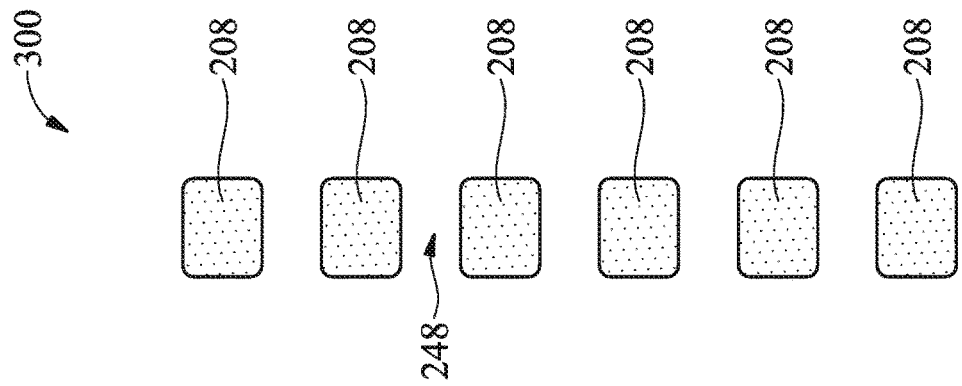
FIG. 16
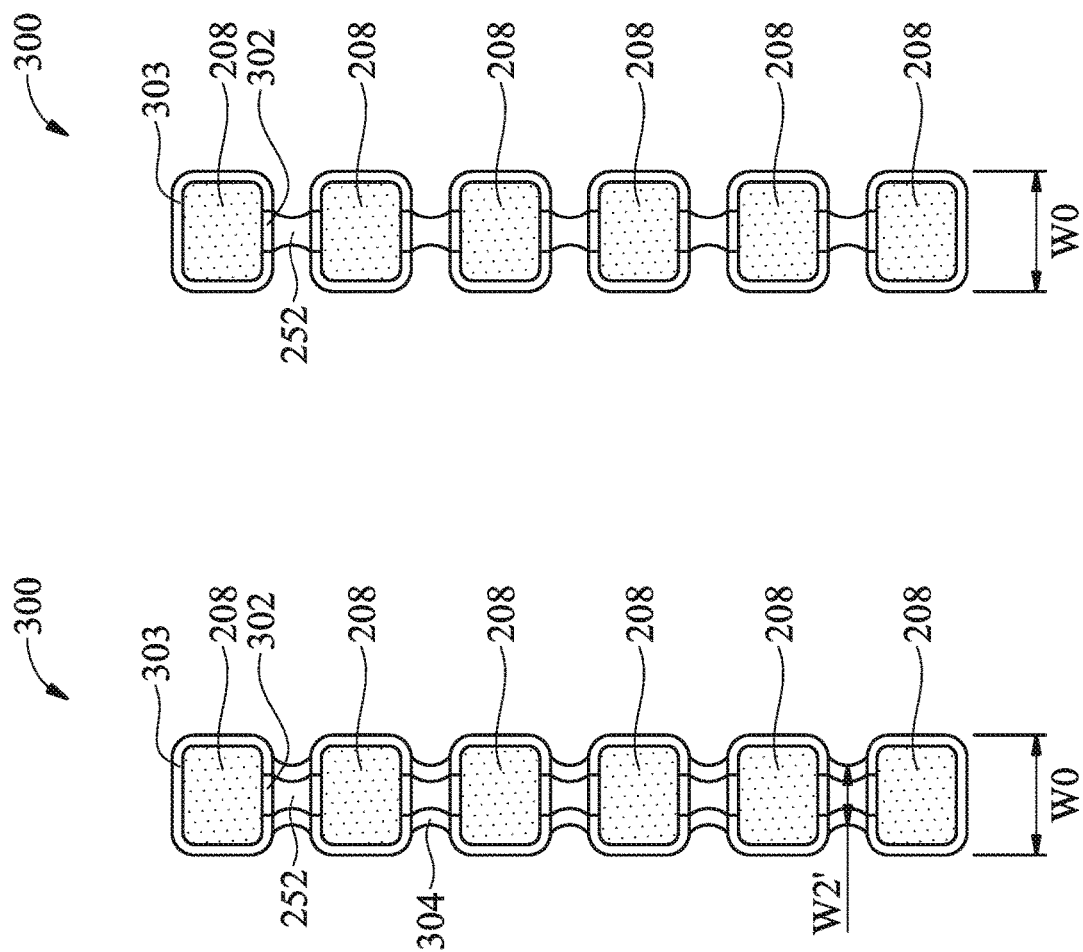
FIG. 15
FIG. 14

INNER SPACER FORMATION IN MULTI-GATE TRANSISTORS

PRIORITY

This application claims priority to U.S. Provisional Patent Application Ser. No. 62/749,491 filed on Oct. 23, 2018, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

Recently, multi-gate transistors have been introduced in an effort to improve gate control by increasing gate-channel coupling, reduce OFF-state current, and reduce short-channel effects (SCEs). One such multi-gate transistor that has been introduced is the fin field-effect transistor (FinFET). The FinFET gets its name from the fin-like structure which extends from a substrate on which it is formed, and which is used to form the FET channel. A further type of multi-gate transistor, introduced in part to address performance challenges associated with some configurations of FinFETs, is the gate-all-around (GAA) transistor. The GAA device gets its name from the gate structure which extends completely around the channel region, providing access to the channel on four sides. GAA devices are compatible with conventional complementary metal-oxide-semiconductor (CMOS) processes and their structure allows them to be aggressively scaled while maintaining gate control and mitigating SCEs. In general, GAA devices may be implemented, for example, in cases where FinFETs can no longer meet performance requirements. However, GAA device fabrication can be challenging, and current methods continue to face challenges with respect to both device fabrication and performance. For example, in a GAA process flow, formation of inner spacers can be an important process to reduce capacitance and prevent leakage between gate stacks and source/drain (S/D) regions. However, dimensions of inner spacers may be hard to control during an etching process. Further, nanowires as channel regions may also suffer damages such as oxidation or loss due to excess etching during the formation of inner spacers, which degrades device performance. Therefore, while the current methods have been satisfactory in many respects, challenges with respect to performance of the resulting device may not be satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 8B, 8C, 8D, 9B, 9C, 9D, 10B, 10C, 10D, 11, 12, 13, 14, 15, 16, 17, 18, 19B, and 19C illustrate cross-sectional views of a semiconductor structure during a fabrication process according to the method of FIGS. 1A-1D, according to aspects of the present disclosure.

DETAILED DESCRIPTION

Figure 1A:
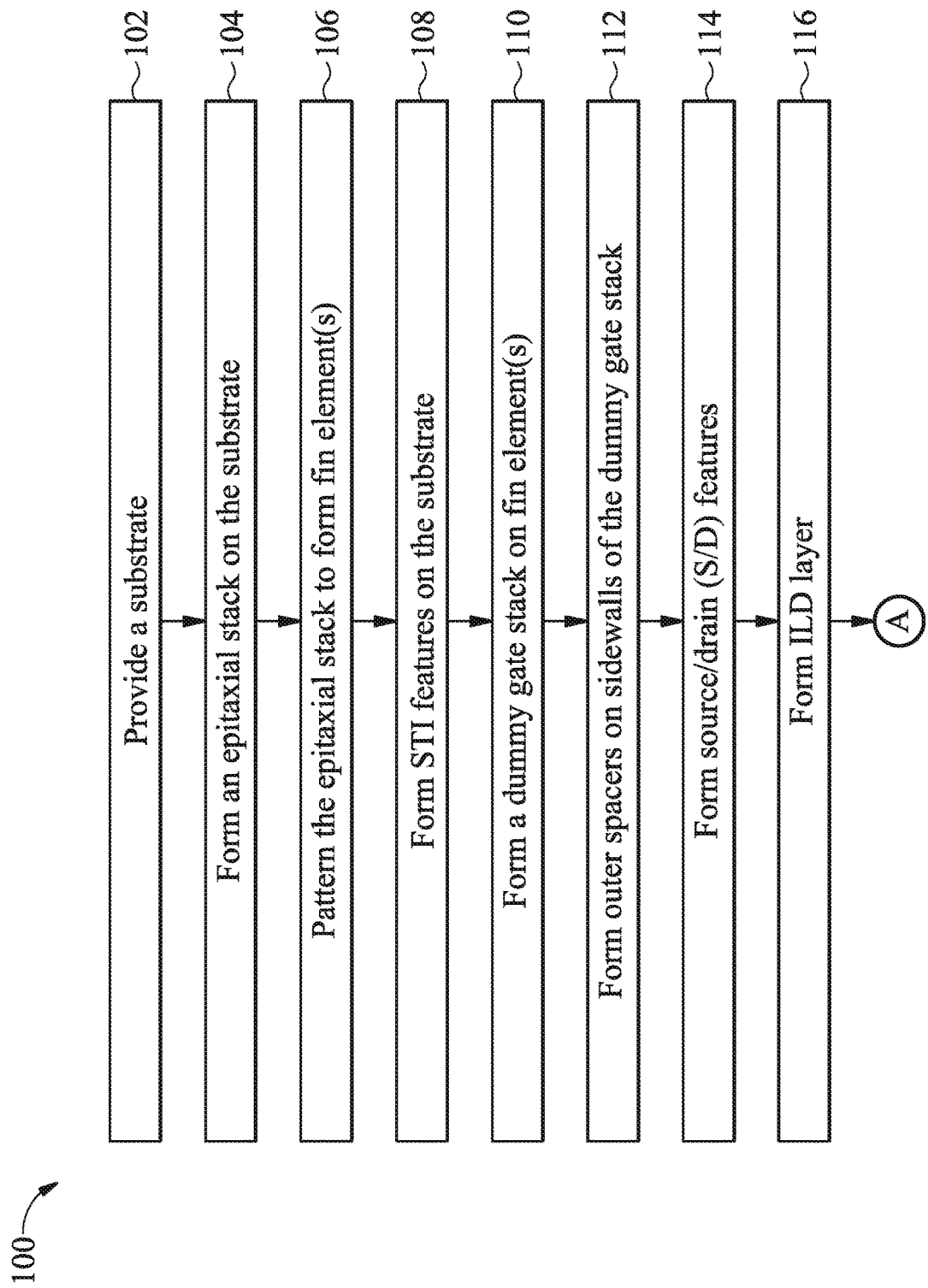
FIGS. 1A, 1B, 1C, and 1D show a flow chart of a method for forming a multi-gate device including inner-spacer features, according to one or more aspects of the present disclosure.
Figure 1B:
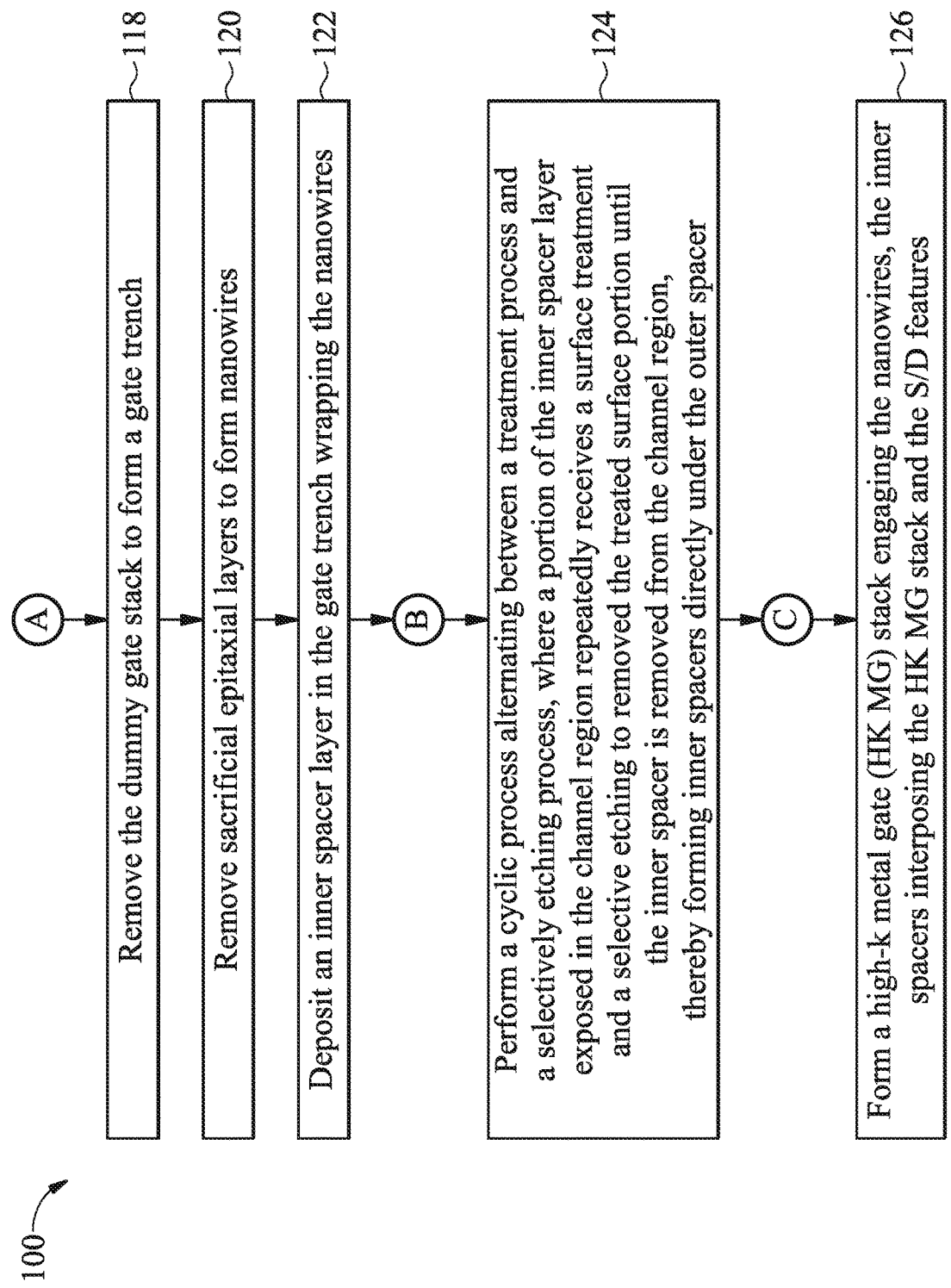

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/−10% of the number described, unless otherwise specified. For example, the term "about 5 nm" encompasses the dimension range from 4.5 nm to 5.5 nm.

The present disclosure is generally related to multi-gate transistors and fabrication methods, and more particularly to inner spacer formation during fabricating gate-all-around (GAA) transistors.

Multi-gate transistors include those transistors whose gate structures are formed on at least two-sides of a channel region. These multi-gate devices may include a p-type metal-oxide-semiconductor device or an n-type metal-oxide-semiconductor device. Specific examples may be presented and referred to herein as FinFET, on account of their fin-like structure. Also presented herein are embodiments of a type of multi-gate transistor referred to as a gate-all-around (GAA) device. A GAA device includes any device that has its gate structure, or portion thereof, formed on 4-sides of a channel region (e.g., surrounding a portion of a channel region). Devices presented herein also include embodiments that have channel regions disposed in nanowire channel(s), bar-shaped channel(s), and/or other suitable channel configurations. Presented herein are embodiments of devices that may have one or more channel regions (e.g., nanowires) associated with a single, contiguous gate structure. However, one of ordinary skill would recognize that the teaching can apply to a single channel (e.g., single nanowire) or any number of channels. One of ordinary skill may recognize other examples of semiconductor devices that may benefit from aspects of the present disclosure.

As scales of the fin width in fin field effect transistors (FinFET) decreases, channel width variations could cause undesirable variability and mobility loss. GAA transistors, such as nanowire transistors are being studied as an alternative to fin field effect transistors. In a nanowire transistor, the gate of the transistor is made all around the channel such that the channel is surrounded or wrapped by the gate. Such a transistor has the advantage of improving the electrostatic control of the channel by the gate, which also mitigates leakage currents. A nanowire transistor includes inner spacers and gate sidewall spacers (also termed as outer spacers), among others. Inner spacers are typically formed by an additional process to outer spacers. For example, after making outer spacers and epitaxially growing source/drain (S/D) features, a space for inner spacers is made by removing sacrificial layers that are alternatively arranged with channel layers. Then, inner spacers are formed by dielectric material deposition and removing a portion of the dielectric material from a channel region. However, portions of the dielectric material stacked between adjacent channel layers have a larger lateral width than on sidewalls of the channel layers. Therefore, it takes longer etching time to remove the portions of the dielectric material from spaces between adjacent channel layers than from sidewalls. To remove the dielectric material in a single etching cycle, sidewalls of the channel layers would be exposed first and remain exposing to etchants for rest of the etching process, which may cause damages to the channel layers. Further, to remove the dielectric material in a single etching cycle, a fine control of inner spacer dimensions may be challenging, such as due to excess etching and loading effects. An object of the present disclosure is to devise an inner spacer formation method so as to accurately control dimensions and positions of the inner spacer and to improved channel length uniformity across different layers of the nanowires, while maintaining integrity of the nanowire.

Illustrated in FIGS. 1A-1D is a method 100 of semiconductor fabrication including fabrication of multi-gate devices. As used herein, the term "multi-gate device" is used to describe a device (e.g., a semiconductor transistor) that has at least some gate material disposed on multiple sides of at least one channel of the device. In some examples, the multi-gate device may be referred to as a GAA device or a nanowire device having gate material disposed on at least four sides of at least one channel of the device. The channel region may be referred to as a "nanowire," which as used herein includes channel regions of various geometries (e.g., cylindrical, bar-shaped, sheet-shaped) and various dimensions. That is, as the term is used herein, "nanowires" includes "nanosheets."

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 100, including any descriptions given with reference to FIGS. 2-15C, as with the remainder of the method and exemplary figures provided in this disclosure, are merely exemplary and are not intended to be limiting beyond what is specifically recited in the claims that follow.

Referring to FIG. 1A, the method 100 begins at step 102 where a substrate is provided. Referring to the example of FIG. 2, in an embodiment of step 102, a substrate 202 is provided. In some embodiments, the substrate 202 may be a semiconductor substrate such as a silicon substrate. The substrate 202 may include various layers, including conductive or insulating layers formed on a semiconductor substrate. The substrate 202 may include various doping configurations depending on design requirements as is known in the art. For example, different doping profiles (e.g., n-wells, p-wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 202 may have isolation features (e.g., shallow trench isolation (STI) features) interposing the regions providing different device types. The substrate 202 may also include other semiconductors such as germanium, silicon carbide (SiC), silicon germanium (SiGe), or diamond. Alternatively, the substrate 202 may include a compound semiconductor and/or an alloy semiconductor. Further, the substrate 202 may optionally include an epitaxial layer (epi-layer), may be strained for performance enhancement, may include a silicon-on-insulator (SOI) structure, and/or may have other suitable enhancement features.

In an embodiment of the method 100, in step 102, an anti-punch through (APT) implant is performed. The APT implant may be performed in a region underlying the channel region of a device for example, to prevent punch-through or unwanted diffusion.

Returning to FIG. 1A, the method 100 then proceeds to step 104 where one or more epitaxial layers are grown on the substrate. With reference to the example of FIG. 2, in an embodiment of step 104, an epitaxial stack 204 is formed over the substrate 202. The epitaxial stack 204 includes epitaxial layers 206 of a first composition interposed by epitaxial layers 208 of a second composition. The first and second composition can be different. In an embodiment, the epitaxial layers 206 are SiGe and the epitaxial layers 208 are silicon (Si). However, other embodiments are possible including those that provide for a first composition and a second composition having different oxidation rates and/or etch selectivity. In some embodiments, the epitaxial layers 206 include SiGe and where the epitaxial layers 208 include Si.

The epitaxial layers 208 or portions thereof may form nanowire channel(s) of the multi-gate device 200. The term nanowire is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The use of the epitaxial layers 208 to define a channel or channels of a device is further discussed below.

Figure 2:
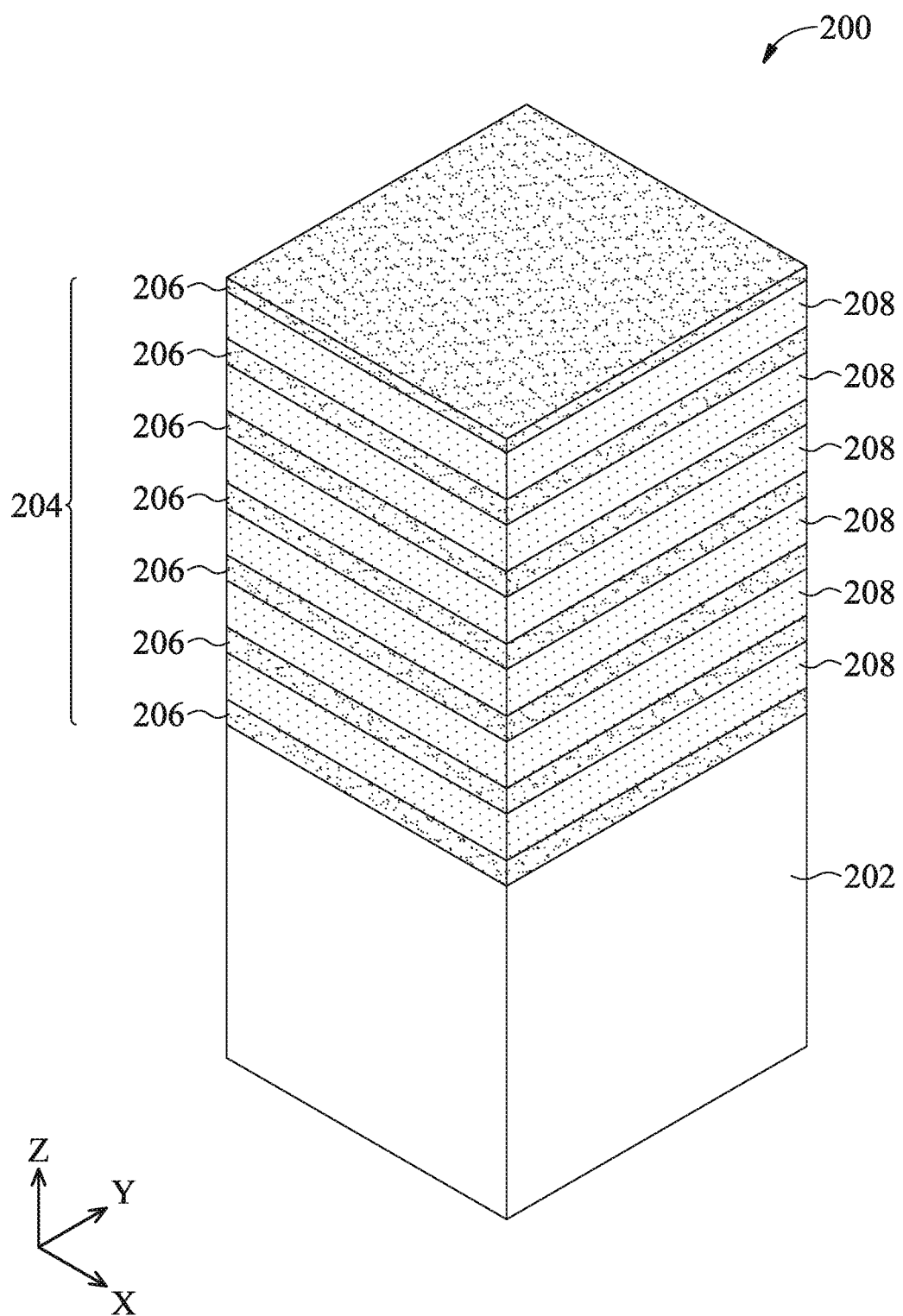
FIGS. 2, 3, 4, 5, 6, 7, 8A, 9A, 10A, and 19A illustrate perspective views of a semiconductor structure during a fabrication process according to the method of FIGS. 1A-1D, according to aspects of the present disclosure.
Figure 3:
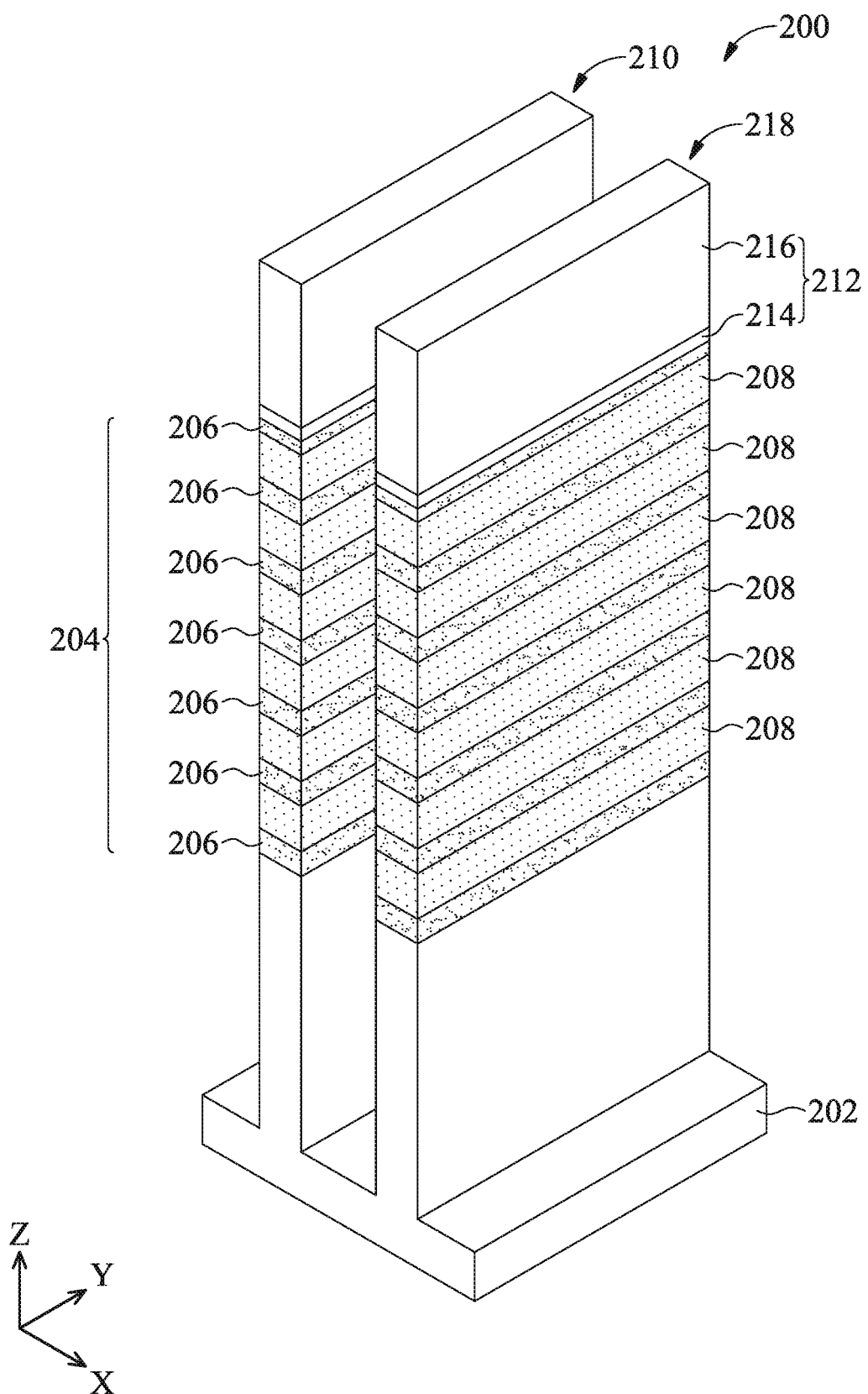

It is noted that seven (7) layers of the epitaxial layers 206 and six (6) layers of the epitaxial layers 208 are alternately arranged as illustrated in FIG. 2, which is for illustrative purposes only and not intended to be limiting beyond what is specifically recited in the claims. It can be appreciated that any number of epitaxial layers can be formed in the epitaxial stack 204; the number of layers depending on the desired number of channels regions for the device 200. In some embodiments, the number of epitaxial layers 208 is between 2 and 10.

In some embodiments, each epitaxial layer 206 has a thickness ranging from about 2 nanometers (nm) to about 6 nm, such as 3 nm in a specific example. The epitaxial layers 206 may be substantially uniform in thickness. Yet in the illustrated embodiment, the top epitaxial layer 206 is thinner (e.g., half the thickness) than other epitaxial layers 206 thereunder. The top epitaxial layer 206 functions as a capping layer providing protections to other epitaxial layers in subsequent processes. In some embodiments, each epitaxial layer 208 has a thickness ranging from about 6 nm to about 12 nm, such as 9 nm in a specific example. In some embodiments, the epitaxial layers 208 of the stack are substantially uniform in thickness. As described in more detail below, the epitaxial layers 208 may serve as channel region(s) for a subsequently-formed multi-gate device and the thickness is chosen based on device performance considerations. The epitaxial layers 206 in channel regions(s) may eventually be removed and serve to define a vertical distance between adjacent channel region(s) for a subsequently-formed multi-gate device and the thickness is chosen based on device performance considerations. Accordingly, the epitaxial layers 206 may also be referred to as sacrificial layers 206, and epitaxial layers 208 may also be referred to as channel layers 208.

By way of example, epitaxial growth of the layers of the stack 204 may be performed by a molecular beam epitaxy (MBE) process, a metalorganic chemical vapor deposition (MOCVD) process, and/or other suitable epitaxial growth processes. In some embodiments, the epitaxially grown layers such as, the epitaxial layers 208 include the same material as the substrate 202. In some embodiments, the epitaxially grown layers 206 and 208 include a different material than the substrate 202. As stated above, in at least some examples, the epitaxial layers 206 include an epitaxially grown silicon germanium (SiGe) layer and the epitaxial layers 208 include an epitaxially grown silicon (Si) layer. Alternatively, in some embodiments, either of the epitaxial layers 206 and 208 may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. As discussed, the materials of the epitaxial layers 206 and 208 may be chosen based on providing differing oxidation, etching selectivity properties. In some embodiments, the epitaxial layers 206 and 208 are substantially dopant-free (i.e., having an extrinsic dopant concentration from about 0 $cm^{-3}$ to about $1\times10^{17}$ $cm^{-3}$), where for example, no intentional doping is performed during the epitaxial growth process.

The method 100 then proceeds to step 106 where fin elements (referred to as fins) are formed by patterning. With reference to the example of FIG. 3, in an embodiment of step 106, a plurality of fins 210 extending from the substrate 202 are formed. In various embodiments, each of the fins 210 includes a substrate portion formed from the substrate 202 and portions of each of the epitaxial layers of the epitaxial stack including epitaxial layers 206 and 208. The fins 210 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins 210 by etching initial epitaxial stack 204. The etching process can include dry etching, wet etching, reactive ion etching (RIE), and/or other suitable processes.

In the illustrated embodiment, a hard mask (HM) layer 212 is formed over the epitaxial stack 204 prior to patterning the fins 210. In some embodiments, the HM layer 212 includes an oxide layer 214 (e.g., a pad oxide layer that may include $SiO_2$) and a nitride layer 216 (e.g., a pad nitride layer that may include $Si_3N_4$) formed over the oxide layer 214. The oxide layer 214 may act as an adhesion layer between the epitaxial stack 204 and the nitride layer 216 and may act as an etch stop layer for etching the nitride layer 216. In some examples, the HM layer 212 includes thermally grown oxide, chemical vapor deposition (CVD)-deposited oxide, and/or atomic layer deposition (ALD)-deposited oxide. In some embodiments, the HM layer 212 includes a nitride layer deposited by CVD and/or other suitable technique.

The fins 210 may subsequently be fabricated using suitable processes including photolithography and etch processes. The photolithography process may include forming a photoresist layer (not shown) over the HM layer 212, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 202, and layers formed thereupon, while an etch process forms trenches 218 in unprotected regions through the HM layer 212, through the epitaxial stack 204, and into the substrate 202, thereby leaving the plurality of extending fins 210. The trenches 218 may be etched using a dry etch (e.g., reactive ion etching), a wet etch, and/or a combination thereof.

Numerous other embodiments of methods to form the fins on the substrate may also be used including, for example, defining the fin region (e.g., by mask or isolation regions) and epitaxially growing the epitaxial stack 204 in the form of the fin 210. In some embodiments, forming the fins 210 may include a trim process to decrease the width of the fins 210. The trim process may include wet and/or dry etching processes.

Figure 4:
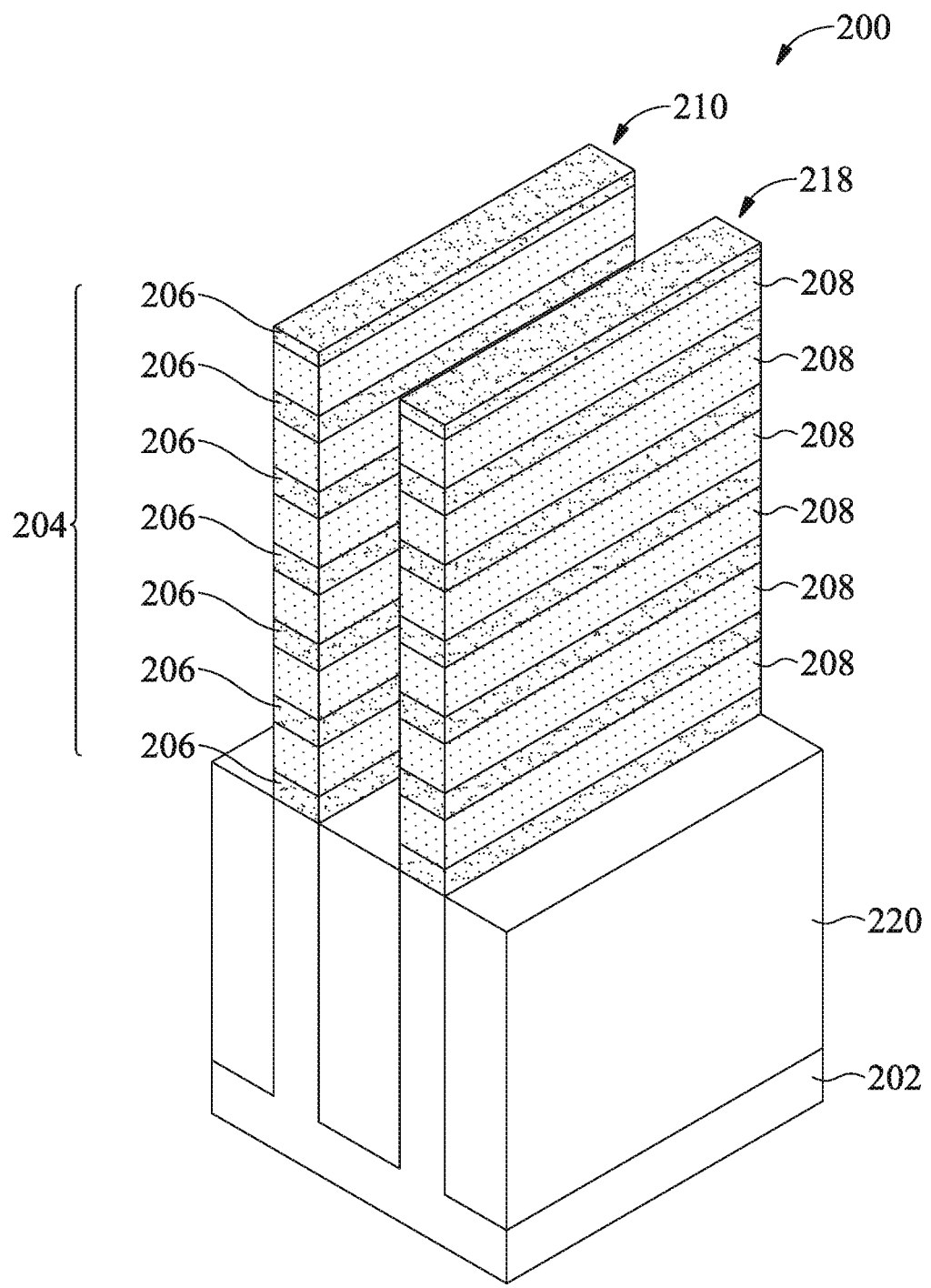

Referring to FIGS. 1A and 4, method 100 proceeds to step 108 by forming shallow trench isolation (STI) features 220 interposing the fins 210. By way of example, in some embodiments, a dielectric layer is first deposited over the substrate 202, filling the trenches 218 with the dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a subatmospheric CVD (SACVD) process, a flowable CVD process, an ALD process, a physical vapor deposition (PVD) process, and/or other suitable process. In some embodiments, after deposition of the dielectric layer, the device 200 may be annealed, for example, to improve the quality of the dielectric layer. In some embodiments, the dielectric layer (and subsequently formed STI features 220) may include a multi-layer structure, for example, having one or more liner layers.

In some embodiments of forming the isolation (STI) features, after deposition of the dielectric layer, the deposited dielectric material is thinned and planarized, for example by a chemical mechanical polishing (CMP) process. In some embodiments, the HM layer 212 (FIG. 3) functions as a CMP stop layer. The STI features 220 interposing between the fins 210 are recessed. Referring to the example of FIG. 4, the STI features 220 are recessed providing the fins 210 extending above the STI features 220. In some embodiments, the recessing process may include a dry etching process, a wet etching process, and/or a combination thereof. The HM layer 212 may also be removed before, during, and/or after the recessing of the STI features 220. The HM layer 212 may be removed, for example, by a wet etching process using $H_3PO_4$ or other suitable etchants. In some embodiments, the HM layer 212 is removed by the same etchant used to recess the STI features 220. In some embodiments, a recessing depth is controlled (e.g., by controlling an etching time) so as to result in a desired height of the exposed upper portion of the fins 210. In the illustrated embodiment, the desired height exposes each of the layers of the epitaxial stack 204.

The method 100 then proceeds to step 110 where sacrificial layers/features are formed and in particular, a dummy gate structure. While the present discussion is directed to a replacement gate process whereby a dummy gate structure is formed and subsequently replaced, other configurations may be possible.

Figure 5:
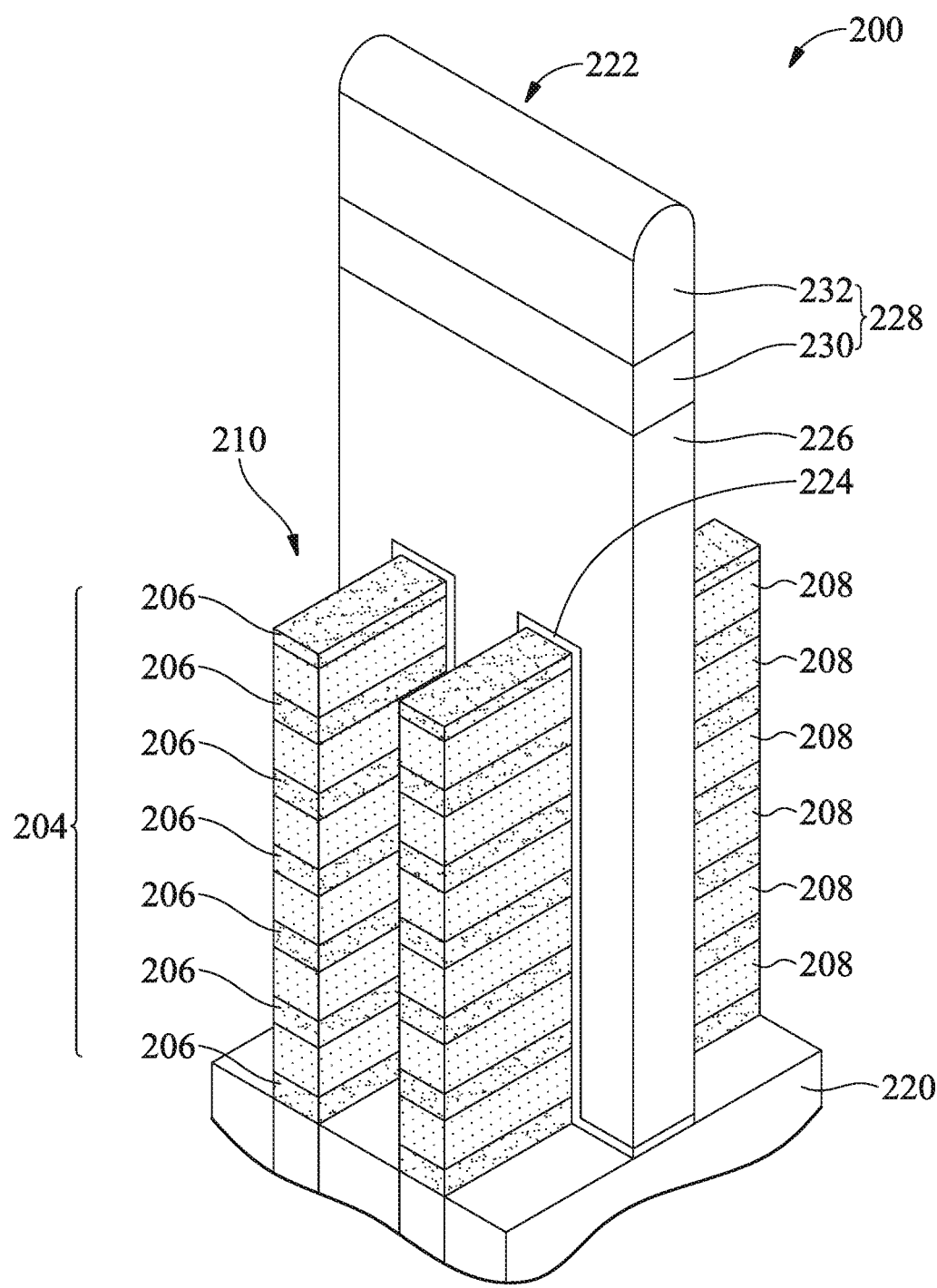

With reference to FIG. 5, a gate stack 222 is formed. In an embodiment, the gate stack 222 is a dummy (sacrificial) gate stack that is subsequently removed (with reference to step 118). Thus, in some embodiments using a gate-last process, the gate stack 222 is a dummy gate stack and will be replaced by the final gate stack at a subsequent processing stage of the device 200. In particular, the dummy gate stack 222 may be replaced at a later processing stage by a high-K dielectric layer (HK) and metal gate electrode (MG) as discussed below. In some embodiments, the dummy gate stack 222 is formed over the substrate 202 and is at least partially disposed over the fins 210. The portion of the fins 210 underlying the dummy gate stack 222 may be referred to as the channel region. The dummy gate stack 222 may also define a source/drain (S/D) region of the fins 210, for example, the regions of the fin 210 adjacent and on opposing sides of the channel region.

In the illustrated embodiment, step 110 first forms a dummy dielectric layer 224 over the fins 210. In some embodiments, the dummy dielectric layer 224 may include $SiO_2$, silicon nitride, a high-K dielectric material and/or other suitable material. In various examples, the dummy dielectric layer 224 may be deposited by a CVD process, a subatmospheric CVD (SACVD) process, a flowable CVD process, an ALD process, a PVD process, or other suitable process. By way of example, the dummy dielectric layer 224 may be used to prevent damages to the fins 210 by subsequent processes (e.g., subsequent formation of the dummy gate stack). Subsequently, step 110 forms other portions of the dummy gate stack 222, including a dummy electrode layer 226 and a hard mask 228 which may include multiple layers 230 and 232 (e.g., an oxide layer 230 and a nitride layer 232). In some embodiments, the dummy gate stack 222 is formed by various process steps such as layer deposition, patterning, etching, as well as other suitable processing steps. Exemplary layer deposition processes include CVD (including both low-pressure CVD and plasma-enhanced CVD), PVD, ALD, thermal oxidation, e-beam evaporation, or other suitable deposition techniques, or combinations thereof. In forming the gate stack for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the electrode layer 226 may include polycrystalline silicon (polysilicon). In some embodiments, the hard mask 228 includes an oxide layer 230 such as a pad oxide layer that may include $SiO_2$. In some embodiments, hard mask 228 includes the nitride layer 232 such as a pad nitride layer that may include $Si_3N_4$, silicon oxynitride and/or silicon carbide.

Still referring to FIG. 5, in some embodiments, after formation of the dummy gate stack 222, the dummy dielectric layer 224 is removed from the S/D regions of the fins 210. The etch process may include a wet etch, a dry etch, and/or a combination thereof. The etch process is chosen to selectively etch the dummy dielectric layer 224 without substantially etching the fins 210, the hard mask 228, and the dummy electrode layer 226.

Figure 6:
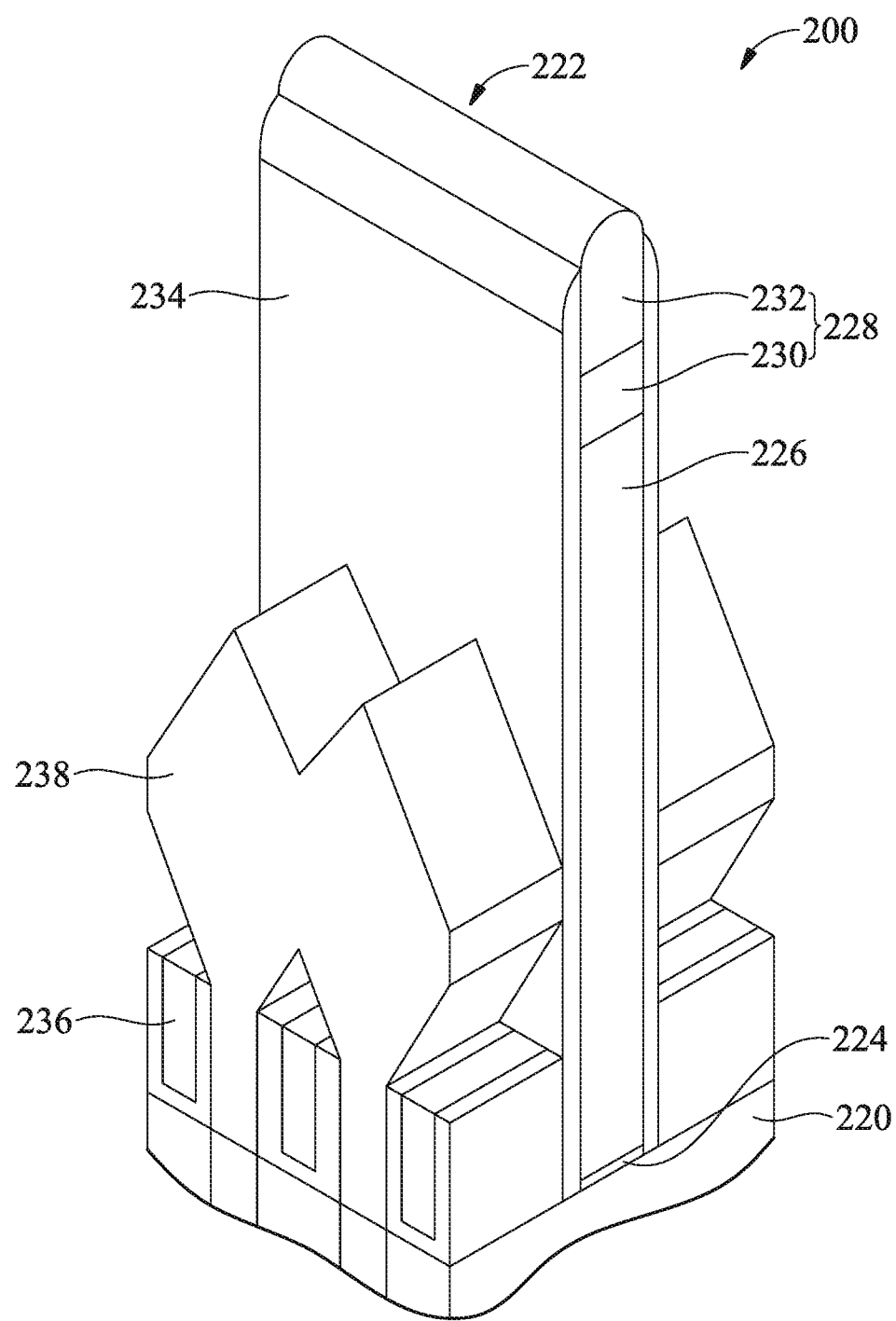

Referring to FIGS. 1A and 6, the method 100 then proceeds to step 112 where a spacer material layer is deposited on the substrate. The spacer material layer may be a conformal layer that is subsequently etched back to form gate sidewall spacers (also referred to as outer spacers, as compared to inner spacers discussed later on). In the illustrated embodiment, a spacer material layer 234 is disposed conformally on top and sidewalls of the dummy gate stack 222. The term "conformally" may be used herein for ease of description upon a layer having substantial same thickness over various regions. The spacer material layer 234 may include a dielectric material such as silicon oxide, silicon nitride, silicon carbide, silicon oxynitride, SiCN films, silicon oxycarbide, SiOCN films, and/or combinations thereof. In some embodiments, the spacer material layer 234 includes multiple layers, such as main spacer walls, liner layers, and the like. By way of example, the spacer material layer 234 may be formed by depositing a dielectric material over the dummy gate stack 222 using processes such as, CVD process, a subatmospheric CVD (SACVD) process, a flowable CVD process, an ALD process, a PVD process, or other suitable process. It is noted that in the illustrated embodiment the spacer material layer 234 also conformally covers sidewalls of the fins 210 in the exposed S/D regions, for example, in an ALD process, and partially fills the space between adjacent fins 210. If there are gaps remained between adjacent fins 210 after filling the spacer material layer 234, step 112 may further deposit other dielectric material, for example, the dielectric material layer 236, to fill up the gaps between adjacent fins 210 in the S/D regions. The dielectric material layer 236 may include silicon oxide, silicon nitride, silicon carbide, silicon oxynitride, SiCN films, silicon oxycarbide, SiOCN films, and/or combinations thereof. In various embodiments, the spacer material layer 234 and dielectric material layer 236 include different material compositions, such as the spacer material layer 234 includes silicon nitride and the dielectric material layer 236 includes silicon carbide.

The step 112 may subsequently perform an anisotropic etching process to expose portions of the fins 210 adjacent to and not covered by the dummy gate stack 222 (e.g., in source/drain regions). Portions of the spacer material layer directly above the dummy gate stack 222 may be completely removed by this anisotropic etching process. Portions of the spacer material layer on sidewalls of the dummy gate stack 222 may remain, forming outer spacers, which are denoted as the outer spacers 234, for the sake of simplicity.

Still referring to FIGS. 1A and 6, the method 100 then proceeds to step 114 where epitaxial S/D features 238 are formed on the substrate. The epi features 238 may be formed by performing an epitaxial growth process that provides an epitaxial material on the fin 210 in the source/drain region. During the epitaxial growth process, the dummy gate stack 222 and outer spacers 234 limit the epitaxial S/D features 238 to the S/D regions. Suitable epitaxial processes include CVD deposition techniques (e.g., vapor-phase epitaxy (VPE) and/or ultra-high vacuum CVD (UHV-CVD)), molecular beam epitaxy, and/or other suitable processes. The epitaxial growth process may use gaseous and/or liquid precursors, which interact with the composition of the substrate 202. In some embodiments, the epitaxial S/D features 238 grown on adjacent semiconductor fins 210 are spaced from each other. In some embodiments, epitaxial S/D features 238 are grown in a way that they are merged, such as illustrated in FIG. 6. In the illustrated embodiment, the height of the fins 210 in the source/drain regions is also recessed before epitaxially growing the epitaxial S/D features 238. As an example, the fins 210 in the source/drain regions may become equal to or lower than the top surface of the STI features 220, and epitaxial S/D features 238 extend upwardly from the top surfaces of the fins 210 to a height above the STI features 220. The epitaxial S/D features 238 interface the epitaxial layers 206 and 208.

In various embodiments, the epitaxial S/D features 238 may include Ge, Si, GaAs, AlGaAs, SiGe, GaAsP, SiP, or other suitable material. The epitaxial S/D features 238 may be in-situ doped during the epitaxial process by introducing doping species including: p-type dopants, such as boron or $BF_2$; n-type dopants, such as phosphorus or arsenic; and/or other suitable dopants including combinations thereof. If the epitaxial S/D features 238 are not in-situ doped, an implantation process (i.e., a junction implant process) is performed to dope the epitaxial S/D features 238. In an exemplary embodiment, the epitaxial S/D features 238 in an NMOS device include SiP, while those in a PMOS device include GeSnB and/or SiGeSnB. Furthermore, silicidation or germano-silicidation may be formed on the epitaxial S/D features 238. For example, silicidation, such as nickel silicide, may be formed by depositing a metal layer over the epitaxial S/D features 238, annealing the metal layer such that the metal layer reacts with silicon in the epitaxial S/D features 238 to form the metal silicidation, and thereafter removing the non-reacted metal layer.

Figure 7:
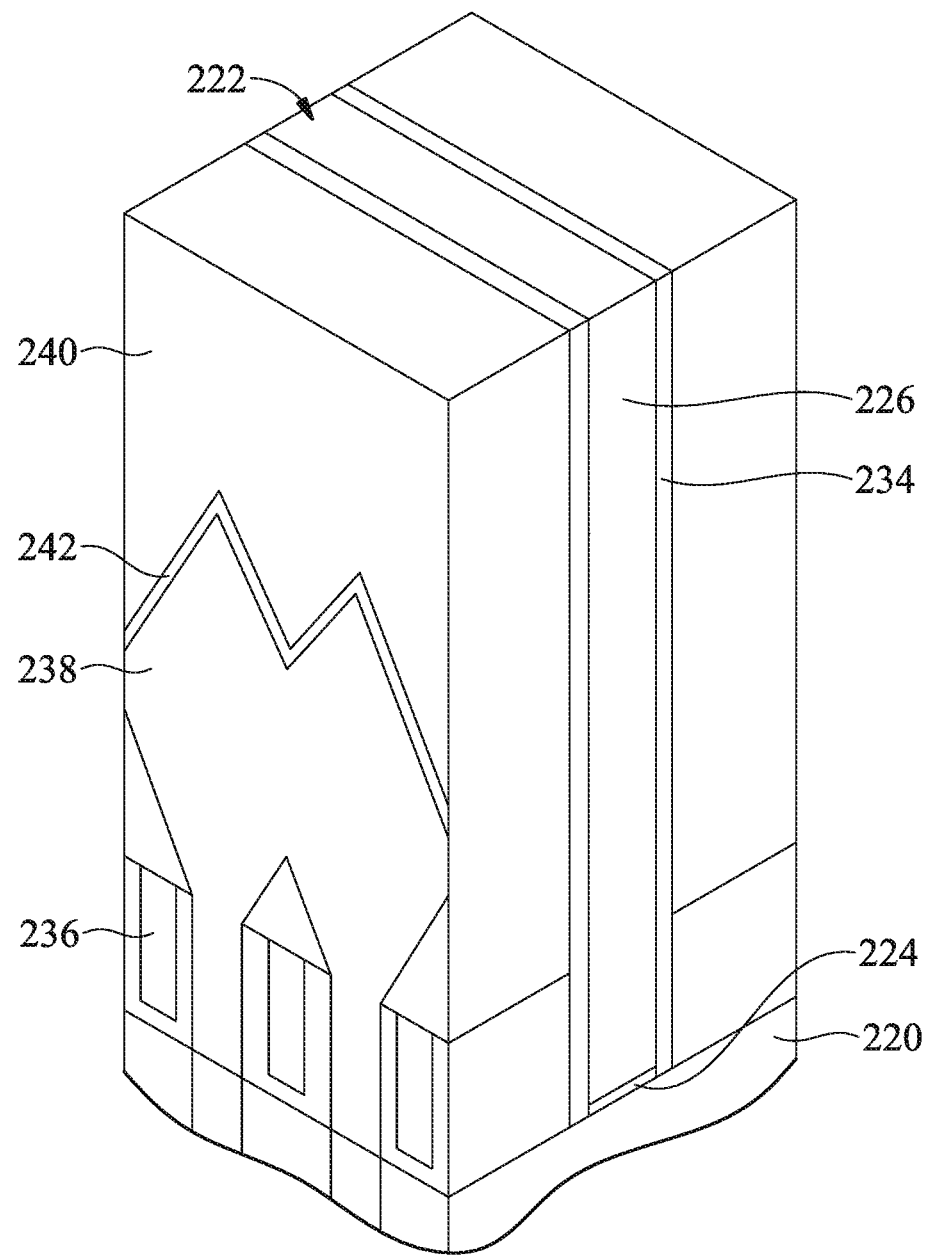

Referring to FIGS. 1A and 7, the method 100 then proceeds to step 116 where an inter-layer dielectric (ILD) layer 240 is formed on the substrate. In some embodiments, a contact etch stop layer (CESL) 242 is also formed prior to forming the ILD layer 240. In some examples, the CESL includes a silicon nitride layer, a silicon oxide layer, a silicon oxynitride layer, and/or other materials known in the art. The CESL 242 may be formed by plasma-enhanced chemical vapor deposition (PECVD) process and/or other suitable deposition or oxidation processes. In some embodiments, the ILD layer 240 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 240 may be deposited by a PECVD process or other suitable deposition technique. In some embodiments, after formation of the ILD layer 240, the semiconductor device 200 may be subject to a high thermal budget process to anneal the ILD layer.

In some examples, after depositing the ILD layer, a planarization process may be performed to remove excessive dielectric materials. For example, a planarization process includes a chemical mechanical planarization (CMP) process which removes portions of the ILD layer 240 (and CESL layer, if present) overlying the gate stack 222 and planarizes a top surface of the semiconductor device 200. In some embodiments, the CMP process also removes hard mask 228 (FIG. 6) and exposes the gate electrode layer 226.

Figure 8B:
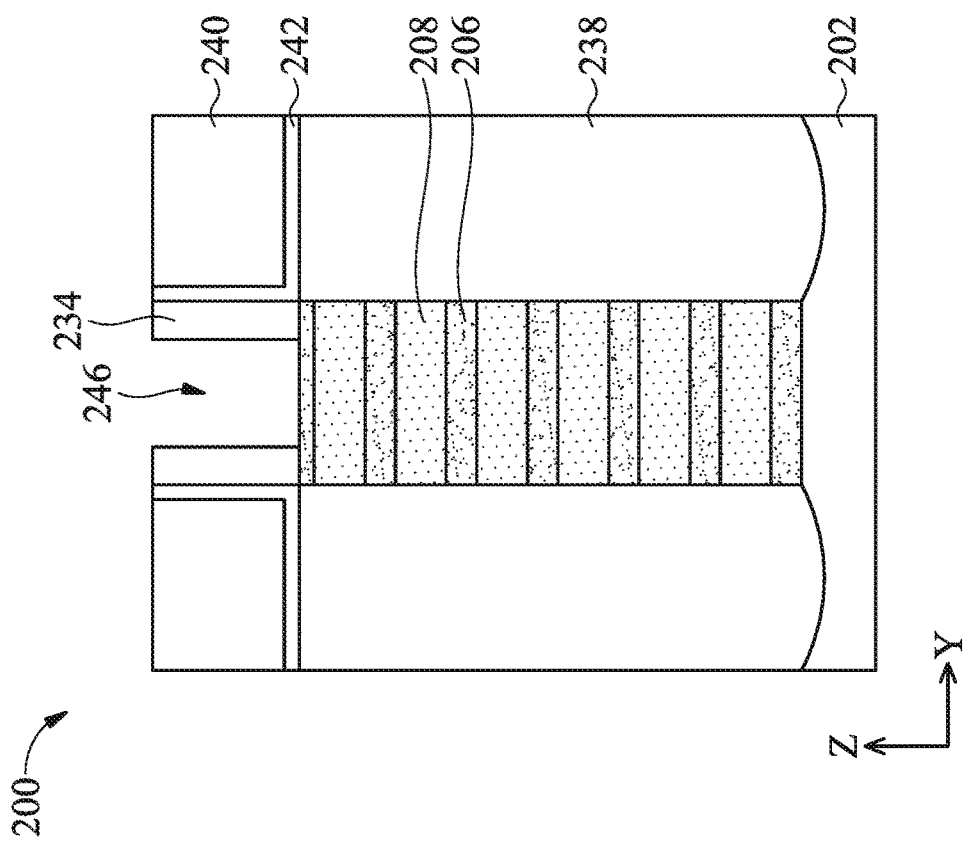
Figure 8A:
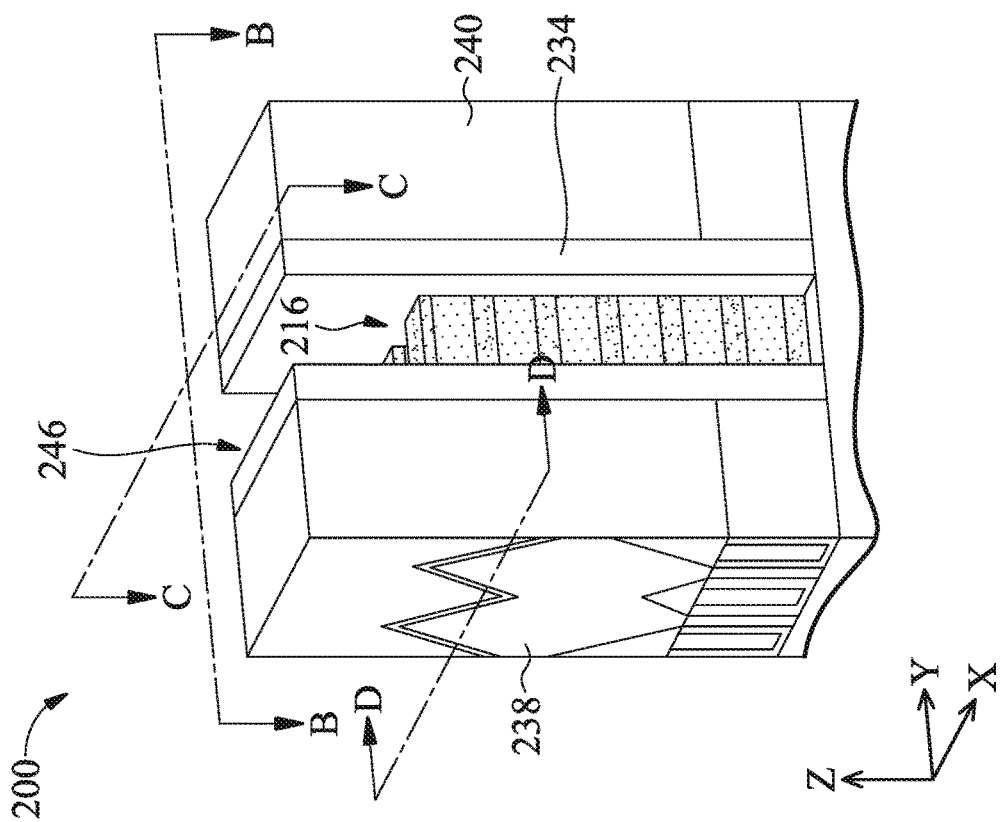
Figure 8D:
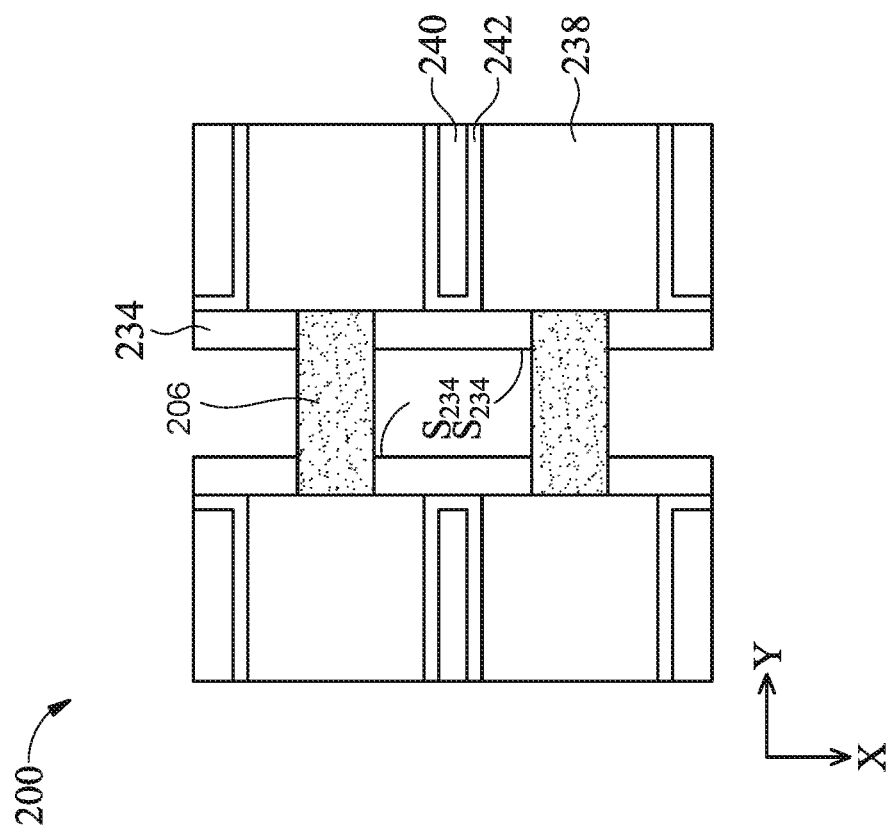
Figure 8C:
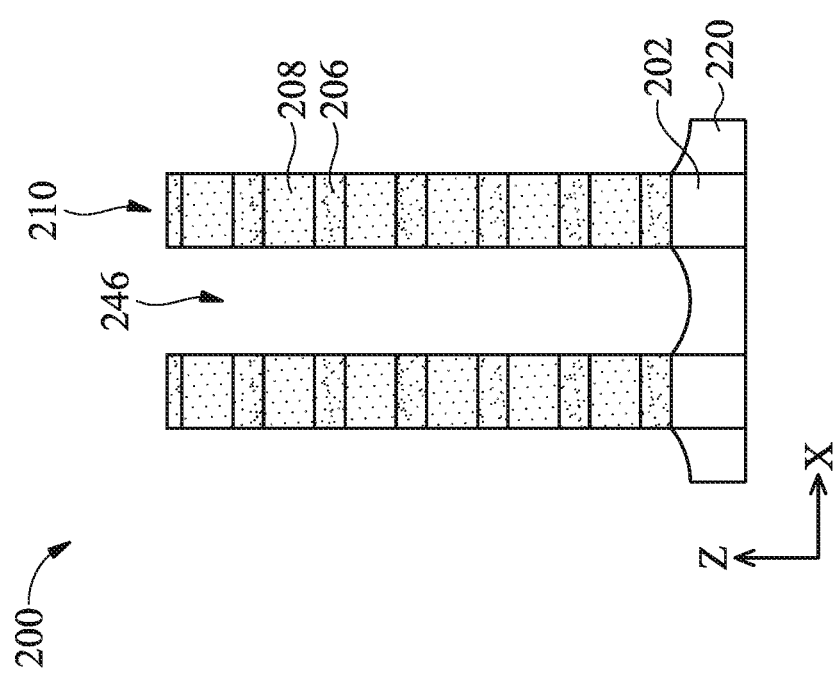
Figure 9B:
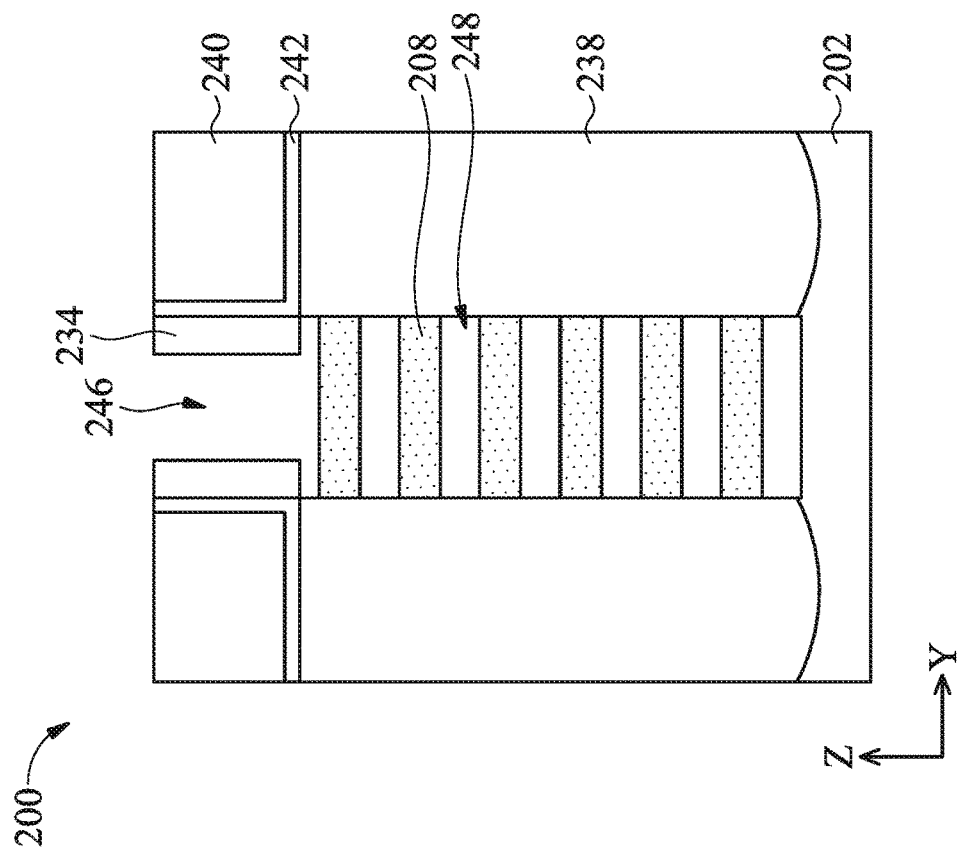
Figure 9A:
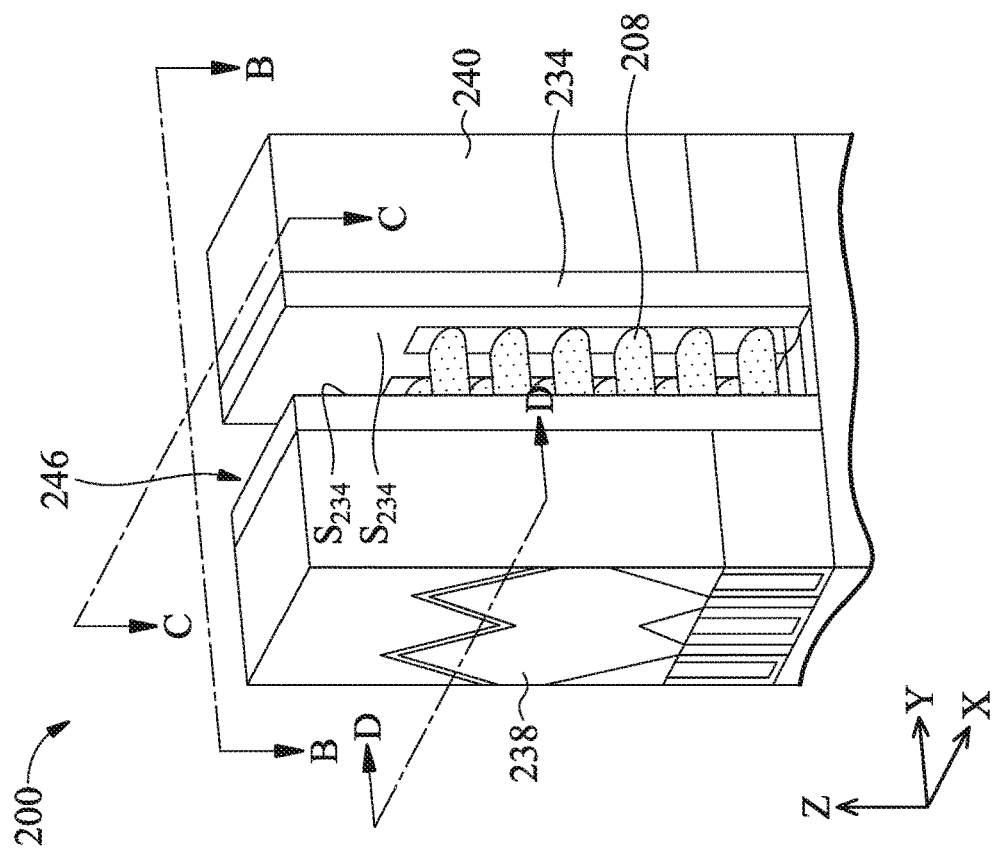
Figure 9D:
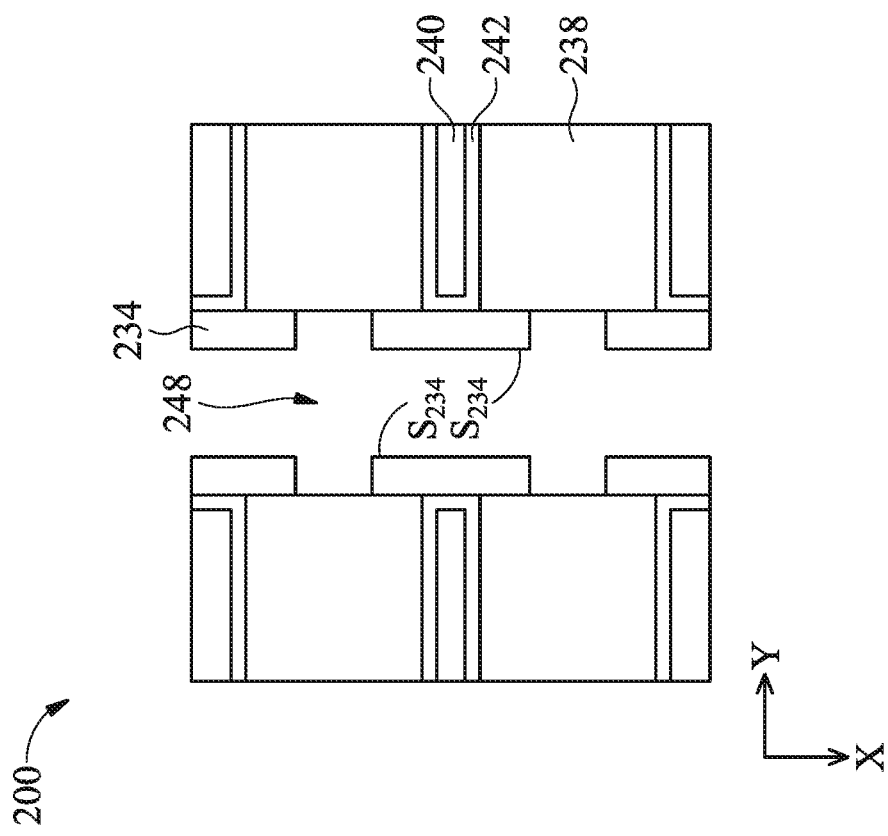
Figure 9C:
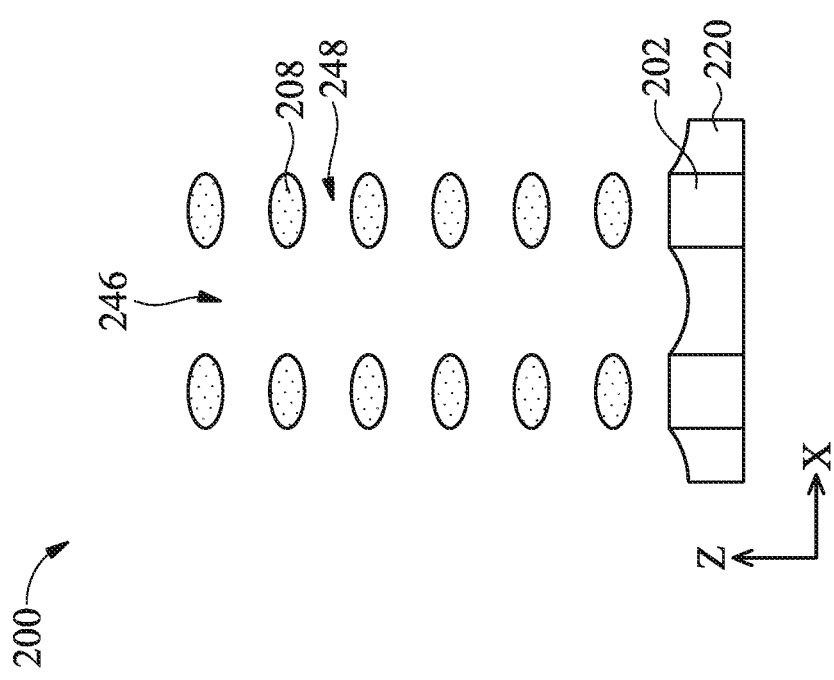
Figure 10B:
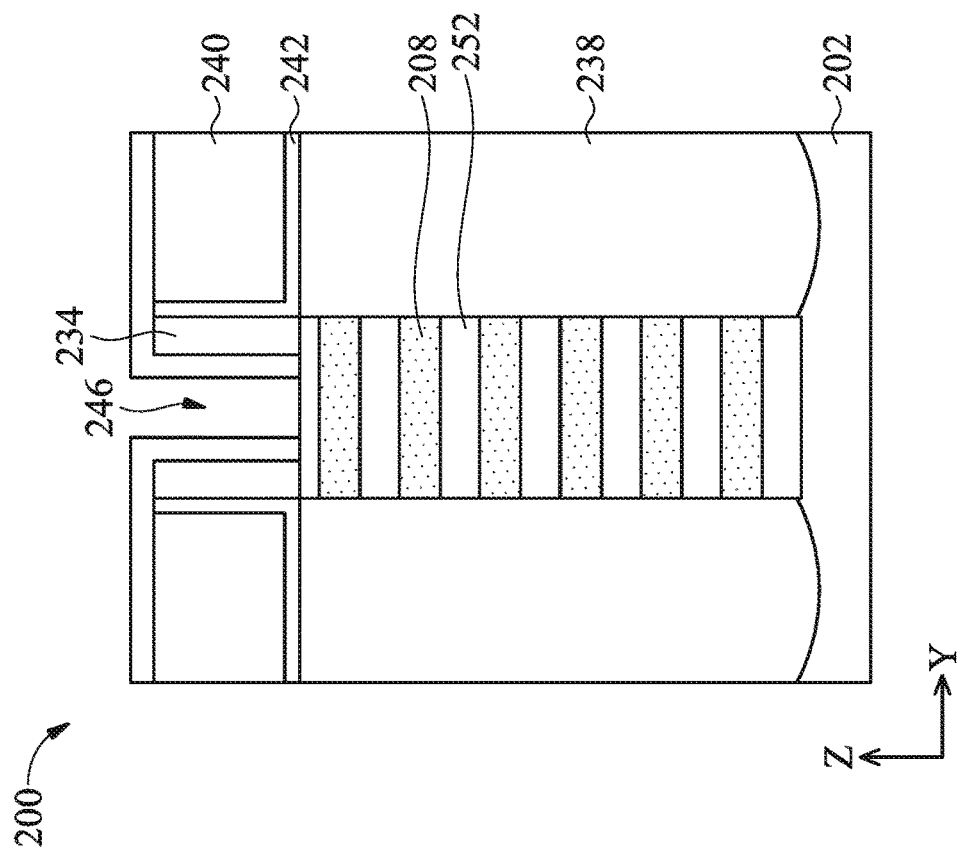
Figure 10A:
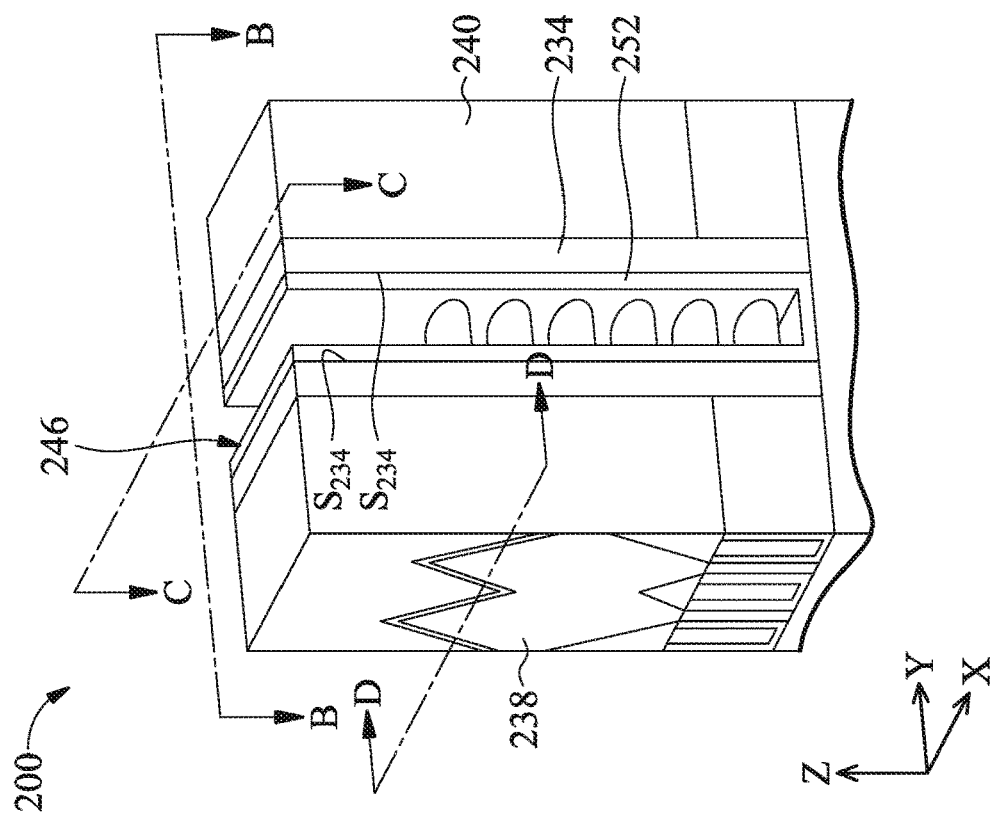

The method 100 then proceeds to step 118 (FIG. 1B) by removing the dummy gate stack 222 to form a gate trench 246 in the channel region. The resultant structure 200 is shown in FIGS. 8A-8D, wherein FIG. 8A is a perspective view of the device 200, FIG. 8B refers to a cross-sectional view taken along a lengthwise direction of the channel (e.g., along the B-B line), FIG. 8C refers to a cross-sectional view taken in the channel region and perpendicular to the lengthwise direction of the channel (e.g., along the C-C line), and FIG. 8D refers to a cross-sectional view taken though one of the epitaxial layer 206 and parallel to a top view (e.g., along the D-D line). A final gate structure (e.g., including a high-K dielectric layer and metal gate electrode) may be subsequently formed in the gate trench 246, as will be described below. The step 118 may include one or more etching processes that are selective to the material in the dummy gate stack 222. For example, the removal of the dummy gate stack 222 may be performed using a selective etch process such as a selective wet etch, a selective dry etch, or a combination thereof. The epitaxial layers 206 and 208 of the fin 210 are exposed in the gate trench 246. The opposing sidewalls $S_{234}$ of the sidewall spacers 234 are also exposed in the gate trench 246.

The method 100 then proceeds to step 120 (FIG. 1B) by removing the epitaxial layers 206 from the fin 210 in the gate trench 246. The resultant structure 200 is shown in FIGS. 9A-9D, which are perspective view and cross-sectional views along the B-B, C-C, D-D lines of the device 200, respectively. In an embodiment, the epitaxial layers 206 are removed by a selective wet etching process. In an embodiment, the epitaxial layers 206 are SiGe and the epitaxial layers 208 are silicon allowing for the selective removal of the epitaxial layers 206. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$. It is noted that as illustrated in the accompanying figures the epitaxial layers 208 (e.g., nanowires) have a substantially rounded shape (e.g., cylindrical) due to removal process of the epitaxial layers 206. In the subsequent discussion, the epitaxial layers 208 are also referred to as the nanowires 208 for the sake of simplicity. It is noted that during the interim processing stage of step 120, gaps 248 are provided between the adjacent nanowires in the channel region (e.g., gaps 248 between epitaxial layers 208). The gaps 248 may be filled with the ambient environment conditions (e.g., air, nitrogen).

The method 100 then proceeds to step 122 (FIG. 1B) by depositing a dielectric material layer 252 in the gate trench 246. As will be shown in further details below, the dielectric material layer 252 is etched and formed into inner spacer features. Therefore, the dielectric material layer 252 is also referred to as the inner spacer material layer 252. The resultant structure 200 is shown in FIGS. 10A-10D, which are perspective view and cross-sectional views along the B-B, C-C, D-D lines of the device 200, respectively. The inner spacer material layer 252 is deposited on opposing sidewalls $S_{234}$ of the outer spacers 234 and over the substrate 202. The inner spacer material layer 252 fill the gaps 248 provided by the removal of the epitaxial layers 206 described in step 120 above and also wraps around each of the nanowires 208 in the channel region. The inner spacer material layer 252 may include a dielectric material, such as SiOC, SiOCN, SiCN, and/or other suitable material. In various embodiments, the outer spacers 234 and the inner spacer material layer 252 include different material compositions, such as the outer spacers 234 includes SiN and the inner spacer material layer 252 includes SiOC. It is noted that in the illustrated embodiment the inner spacer material layer 252 is conformally deposited on sidewalls $S_{234}$ of the outer spacers 234 and on each of the nanowires of the fins 210 in the channel region, for example, by an ALD process.

The method 100 then proceeds to step 124 (FIG. 1B) where portions of the inner spacer material layer 252 are removed from the channel region, while other portions directly under the outer spacers 234 and abutting the epitaxial S/D features 238 remain as inner spacer features. Traditionally, portions of the inner spacer material layer 252 in the channel region first receives a surface treatment (e.g., oxidation or nitridation) to exhibit an etching selectivity upon other portions that are protected by the outer spacers 234, and are subsequently removed from the channel region in a single etching cycle. Inner spacer formation with a single etching cycle faces some challenges.

Figure 11:
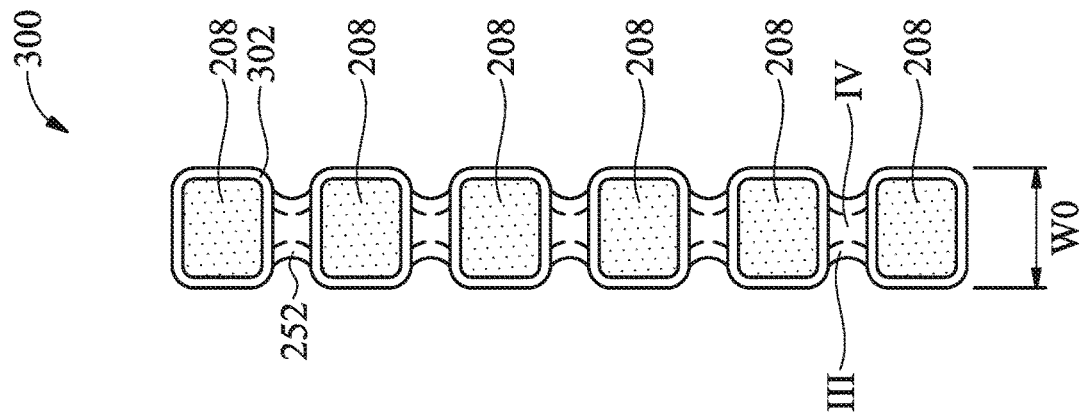

First, the inner spacer material layer in the channel region may not fully receive the surface treatment. For the sake of clarity, a region 300 denoted with dotted lines in FIG. 10C, which includes vertically stacked nanowires 208 wrapped by the inner spacer material layer 252 in a cross-sectional view of the channel region, is separately depicted in FIG. 11. A native oxide layer 302 on surfaces of the nanowires 208 is also shown. As illustrated in FIG. 11, the thickness of the inner spacer material layer 252 on sidewalls of the nanowires 208 (denoted as $W_1$) is generally thinner than the lateral width of the portion stacked between adjacent nanowires 208 (denoted as $W_2$). In a specific example, thickness $W_1$ on the sidewalls is about 10% to about 40% of a width of the nanowires 208 (denoted as $W_0$), such as about 30%, and the lateral width $W_2$ is about 120% to about 150% of $W_0$, such as about 130%. If a high density dielectric material is deposited to form the inner spacer material layer 252, such as SiOCN or SiCN material with a density larger than 2.5 g/cm$^3$, the surface treatment may not be able to reach a distance about $W_2/2$ towards a center portion of the inner spacer material layer 252 stacked between adjacent nanowires 208. As a result, the center portion of the inner spacer material layer 252 stacked between adjacent nanowires 208 is free of the surface treatment and may not exhibit enough etching selectivity to be removed from the subsequent etching process.

Second, even if the surface treatment thoroughly treats the inner spacer material layer 252 in the channel region, to ensure the center portion of the inner spacer material layer 252 stacked between adjacent nanowires 208 would be completely removed, the subsequent etching process may have to take a sufficiently long time, while critical dimensions (CD) become hard to control in an excess etching. Also exposing sidewalls of the nanowires 208 for a significant duration in an excess etching may cause damages to the nanowires. Further, the portion of the inner spacer material layer 252 directly under the outer spacers 234 may also be over etched during the excess etching. Over-etched inner spacer features may cause high parasitic capacitances between to-be-formed metal gates and S/D features.

As a comparison, step 124 uses a cyclic process alternating between a surface treatment process and a selective etch process. In the cyclic process, portions of the inner spacer material layer 252 exposed in the channel region repeatedly receive a surface treatment and a subsequent selective etch process to remove the treated surface portion. The cyclic process continues until the inner spacer material layer 252 is completely removed from the channel region, with other portions directly under the outer spacer 234 remaining as inner spacer features. As an example, in FIG. 11, dotted lines divide the inner spacer material layer 252 into multiple regions, such as four regions I, II, III, and IV. Accompanying the illustrated drawing, a surface treatment is first applied to region I. Since thickness of region I is thinner than the maximum depth the surface treatment is able to reach, region I receives thorough surface treatment. Then a selective etch process removes region I from the inner spacer layer 252. The cyclic process then repeats the surface treatment and the selective etch process to remove regions II, III, and IV, one after another in sequence. Instead of removing regions I, II, III, and IV all in once, cyclic process only needs to process a much thinner material layer each time. The precision of CD control during the etch process is also increased. The four regions I, II, II, and IV and corresponding four cycles of the cyclic process are provided for illustration purposes and does not necessarily limit the embodiments of the present disclosure to any number of regions and any number of cycles of the cyclic process. For example, the number of regions and corresponding cycles of the cyclic process may range from 2 to 100.

Step 124 may have various embodiments. In some embodiments, the inner spacer material layer 252 is an oxygen containing (e.g., SiOCN or SiOC) layer and the cyclic process includes an oxidation process as the surface treatment, as shown in FIG. 1C.

Step 124 starts at operation 152, where an oxidation process as a surface treatment is performed. In various embodiments, the surface treatment is through the gate trench 246, using the sidewall spacers 234 as a treatment mask. A middle portion of the inner spacer material layer 252 between two opposing sidewalls $S_{234}$ of the sidewall spacers 234 (FIG. 10A) receives the surface treatment, resulting in a material composition change, such that an etch selectivity exhibits compared to other parts of the inner spacer material layer 252. In some embodiments, the oxidation process includes a plasma with $H_2O$, $O_2$, or a combination thereof, as an oxygen radical treatment. The oxygen radicals react with components, for example, C, H, S, and N, to afford their respective oxides which are volatile. In a specific example, the inner spacer material layer 252 includes SiOCN or SiOC. During the plasma treatment, carbon or nitrogen is released in the form of carbon oxide or nitrogen oxide, while silicon is oxidized and remains in the form of silicon oxide as a surface portion of the inner spacer material layer 252. The temperature for the plasma treatment may be higher than 200° C. The high reaction temperature accelerates the release of non-oxygen elements from the inner spacer material layer 252.

Step 124 then proceeds to operation 154, where a selective etch process is applied to remove the oxidized surface portion formed in operation 152, as the etch process that is tuned to be selective to oxide and does not substantially etch the portion underneath. The etch process may include wet etching, dry etching, reactive ion etching, or other suitable etching methods. For example, a dry etch process may implement an oxygen-containing gas, a fluorine-containing gas (e.g., $CF_4$, $SF_6$, $CH_2F_2$, $CHF_3$, and/or $C_2F_6$), a chlorine-containing gas (e.g., $Cl_2$, $CHCl_3$, $CCl_4$, and/or $BCl_3$), a bromine-containing gas (e.g., HBr and/or $CHBR_3$), an iodine-containing gas, other suitable gases and/or plasmas, and/or combinations thereof. For example, a wet etch process may comprise etching in diluted hydrofluoric acid (DHF), potassium hydroxide (KOH) solution, ammonia, a solution containing hydrofluoric acid (HF), nitric acid ($HNO_3$), and/or acetic acid ($CH_3COOH$), or other suitable wet etchants. In a specific example, the oxidized surface portion includes $SiO_2$ and a chemical etchant gas containing HF and $NH_3$ is applied at temperature under 45° C. The low temperature keeps the etchant in a high etching selectivity towards the oxide. The chemical reaction can be described as

where byproduct ammonium hexafluorosilicate (($NH_4$)$_2$$SiF_6$) stays in solid form. The operation 154 may subsequently increase the temperature to decompose the byproduct, such as at a temperature about 80° C. The chemical reaction can be described as

Figure 12:
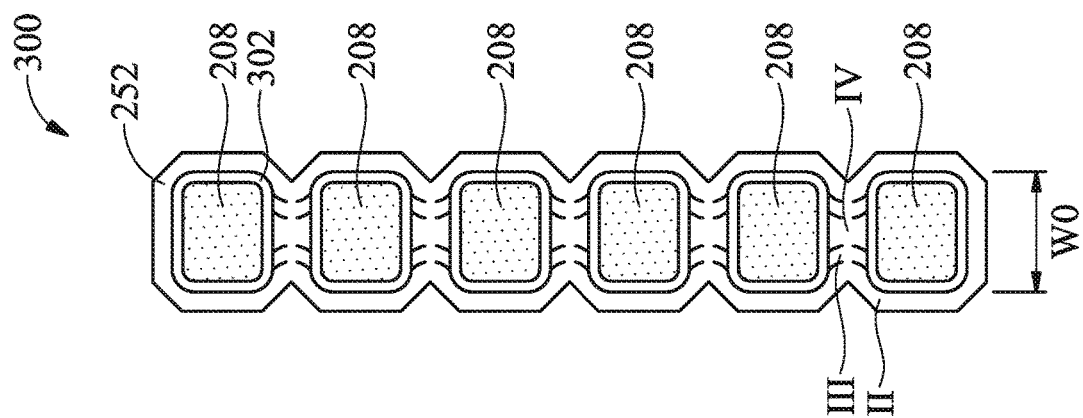

After the byproduct is decomposed, the original material of the inner spacer material layer 252 is exposed. By losing a surface portion after operation 152 and operation 154, the inner spacer material layer 252 is thinned. In the illustrated embodiment, after one cycle of operation 152 and operation 154, region I of the inner spacer material layer 252 is removed, as shown in FIG. 12.

Figure 13:
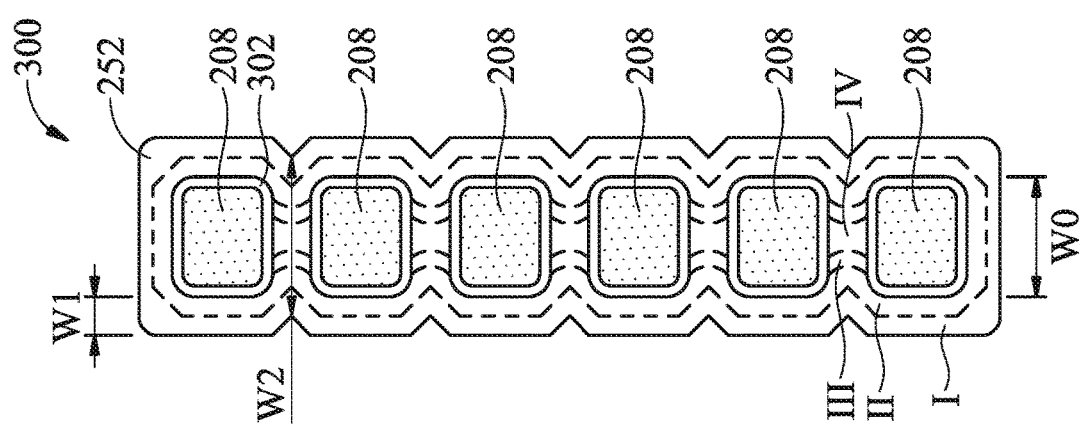

Step 124 then repeats operations 152 and 154, until the inner spacer material layer 252 is removed from sidewalls of the nanowires 208 and the nanowires 208 are partially exposed, as shown in FIG. 13. Portions of the inner spacer material layer 252 stacked between adjacent nanowires 208 remain. For example, if the inner spacer material layer 252 on sidewalls of the nanowire 208 has a thickness $W_1$ and a cycle of operations 152 and 154 removes half thickness of $W_1$, step 124 repeats operations 152 and 154 for one more time ( ). Or if a cycle of operations 152 and 154 etches one third thickness of $W_1$, step 124 repeats operations 152 and 154 for another two times. The removal thickness can be controlled by a time mode (e.g., by controlling an oxidation time and an etching time). In some embodiments, operations 152 and 154 are in-situ, such that operations are performed without breaking hermetical seal of the processing chamber.

Surfaces of the nanowires 208 is covered by a native oxide layer 302, which would be etched if the cyclic process otherwise continues. Step 124 thus temporarily pauses the cyclic process of operations 152 and 154, and proceeds to operation 156 to perform a passivation process to the native oxide layer 302, in order to protect the nanowires 208 from continuing cyclic process. In some embodiments, the passivation process includes a nitrogen treatment, such as a nitrogen plasma treatment. During the nitrogen plasma treatment, the native oxide layer 302 is converted to a nitride passivation layer 303, which acts as an etching stop layer to protect the nanowires 208 from subsequent cyclic process. A surface portion of the inner spacer material layer 252 may also be nitrified and converted to a oxynitride layer 304, as shown in FIG. 14. In some embodiments, a portion of the native oxide layer 302 that is stacked between nanowires 208 and inner spacer material layer 252 does not expose to the nitrogen plasma treatment and remains as a native oxide layer.

Step 124 then continues to operation 158, where an oxidation process as a surface treatment is performed to the oxynitride layer 304 and remaining inner spacer material layer 252 between adjacent nanowires 208. Depending on oxidation thickness of one cycle of operation 158, if the oxidation thickness is larger than thickness of the oxynitride layer 304, the oxynitride layer 304 and a surface portion of the remaining inner spacer material layer 252 are converted to oxide; if the oxidation thickness is smaller than thickness of the oxynitride layer 304, it may take operation 158 and operation 160 (to be discussed below) two or more cycles to fully convert the oxynitride layer 304 to oxide and remove. Many aspects of operation 158 are the same as or similar to those of operation 152, which are not repeated below in interest of conciseness. Step 124 then continues to operation 160, where a selective etching process is applied to remove the oxidized surface portion formed in operation 158, as the etching process that is tuned to be selective to oxide and does not substantially etch the portion underneath. Many aspects of operation 160 are the same as or similar to those of operation 154, which are not repeated below in interest of conciseness. In the illustrated embodiment, after one cycle of operation 158 and operation 160, region 300 is illustrated in FIG. 15. Depending on oxidation and etching thickness of operation 158 and operation 160, the remaining portion of the native oxide layer 302 may remain cover by the inner spacer material layer 252 after one cycle of operation 158 and operation 160, in some embodiments. Alternatively, a portion of the remaining portion of the native oxide layer 302 may be exposed after one cycle of operation 158 and operation 160.

Step 124 then repeats operations 158 and 160, until the inner spacer material layer 252 stacked between adjacent nanowires 208 is removed, as shown in FIG. 16. For example, if the remaining inner spacer material layer 252 stacked between adjacent nanowire 208 has a lateral thickness W2' and a cycle of operations 158 and 160 removes a thickness of about 25% of W2', step 124 repeats operations 158 and 156 for extra three times. Or if a cycle of operations 158 and 160 etches a thickness of 20% of W2', step 124 repeats operations 158 and 160 extra four times. Step 124 may further include a cleaning process after the cyclic process to remove the nitride passivation layer from the nanowires 208.

Figure 1D:
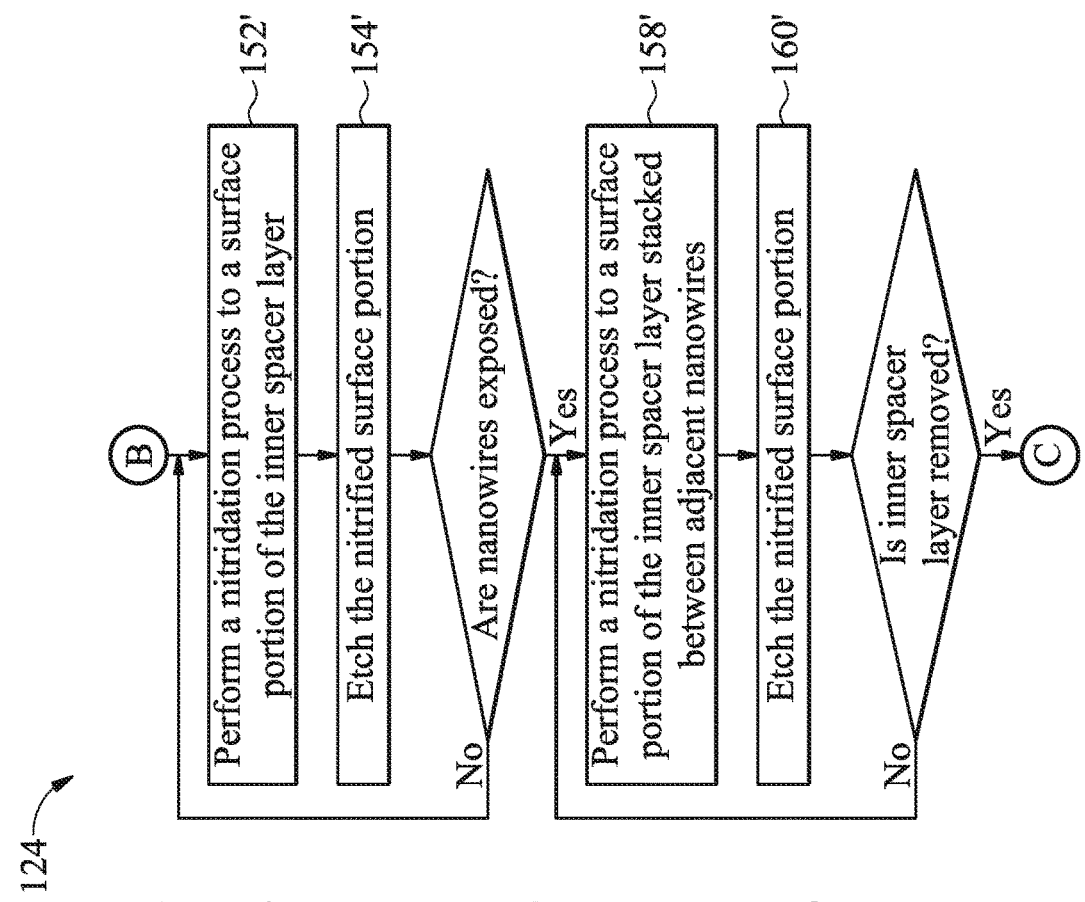
Figure 1C:
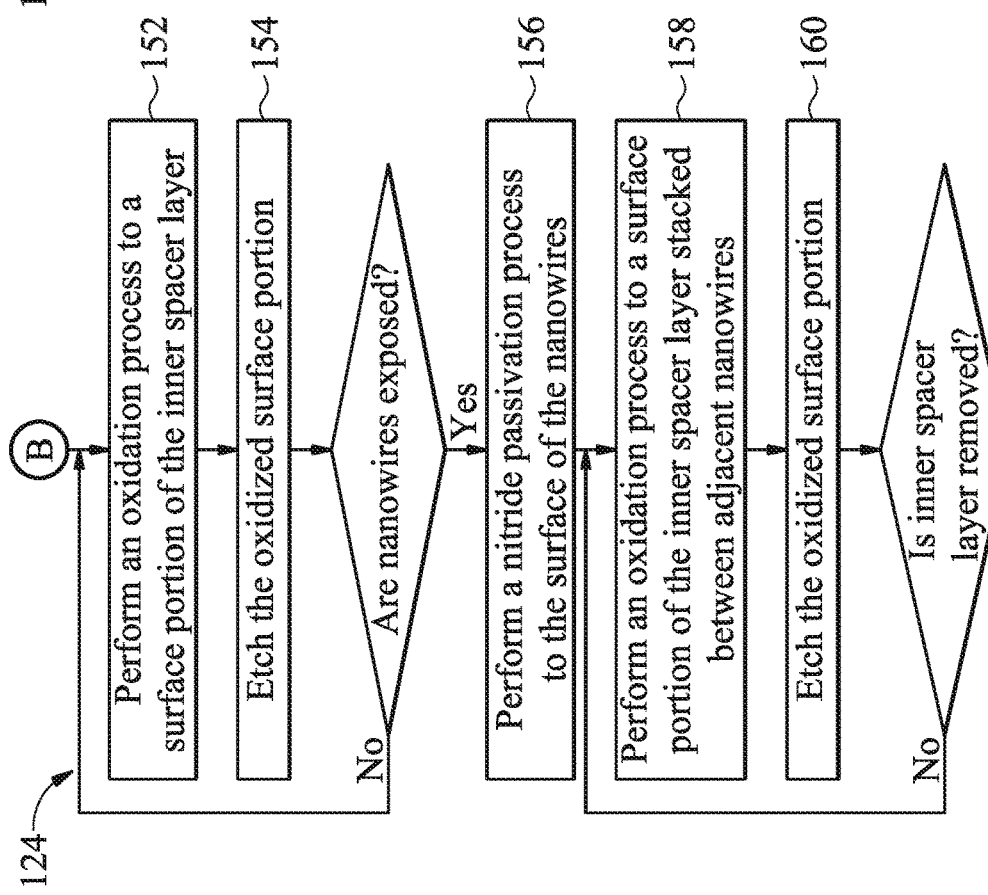

In some alternative embodiments, the inner spacer material layer 252 includes low percentage or substantially free of oxygen (e.g., SiCN) and the cyclic process includes a nitridation process, as shown in FIG. 1D.

Steps 124 starts at operation 152', where a nitridation process as a surface treatment is performed. Similar to operation 152 discussed above, in various embodiments, the surface treatment is through the gate trench 246, using the sidewall spacers 234 as a treatment mask. A middle portion of the inner spacer material layer 252 between two opposing sidewalls $S_{234}$ of the sidewall spacers 234 (FIG. 10A) receives the surface treatment, resulting in a material composition change, such that an etch selectivity exhibits compared to other parts of the inner spacer material layer 252. In some embodiments, the nitridation process includes a plasma with $NH_3$, $H_2$, or a combination thereof, for nitrogen radical treatment. The nitrogen radicals react with components, for example, C and S, to afford their respective nitride which are volatile. In a specific example, the inner spacer material layer 252 includes SiCN, which releases C and is converted to silicon nitride ($Si_3N_4$) after the nitrogen plasma treatment. The temperature for the plasma treatment may be higher than 200° C. The high reaction temperature accelerates the release of non-nitrogen elements from the inner spacer material layer 252.

Step 124 then proceeds to operation 154', where a selective etch process is applied to remove the nitrified surface portion formed in operation 152', as the etch process that is tuned to be selective to nitride and does not substantially etch the portion underneath. The etch process may include wet etching, dry etching, reactive ion etching, or other suitable etching methods. In a specific example, the nitrified surface portion includes $Si_3N_4$ and a chemical etchant gas containing HF and $NH_3$ is applied at temperature under 45° C. The low temperature keeps the etchant in a high etching selectivity towards the oxide. The chemical reaction can be described as

where byproduct ammonium hexafluorosilicate $((NH_4)_2SiF_6)$ stays in solid form. The operation 154' may subsequently increase the temperature to decompose the byproduct, such as at a temperature about 80° C. The chemical reaction can be described as

After the byproduct is decomposed, the original material of the inner spacer material layer 252 is exposed. By losing a surface portion after operation 152 and operation 154, the inner spacer material layer 252 is thinned.

Step 124 then repeats operations 152' and 154', until the inner spacer material layer 252 is removed from sidewalls of the nanowires 208 and the nanowires 208 are partially exposed, as shown in FIG. 13. The portion of the inner spacer material layer 252 stacked between adjacent nanowires 208 remains. For example, if the inner spacer material layer 252 on sidewalls of the nanowire 208 has a thickness $W_1$ and a cycle of operations 152' and 154' removes half thickness of of $W_1$, step 124 repeats operations 152' and 154' for one more time. Or if a cycle of operations 152' and 154' etches a thickness of one third of $W_1$, step 124 repeats operations 152' and 154' for another two times. The removal thickness can be controlled by a time mode (e.g., by controlling an oxidation time and an etching time).

Figure 18:
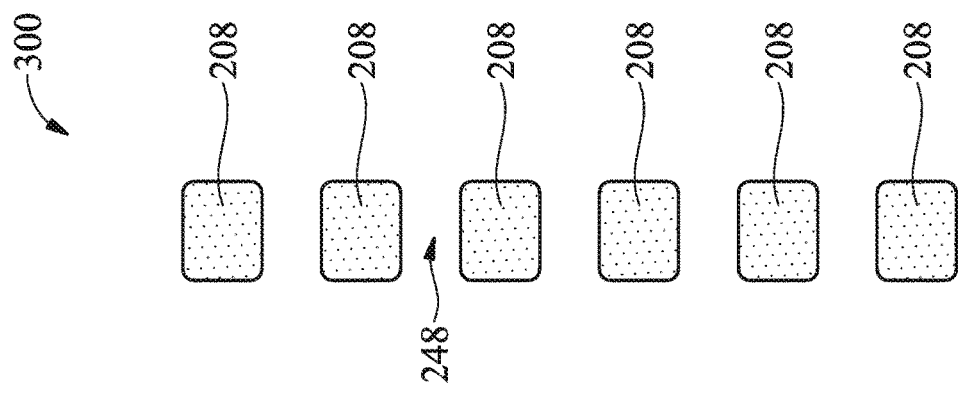
Figure 17:
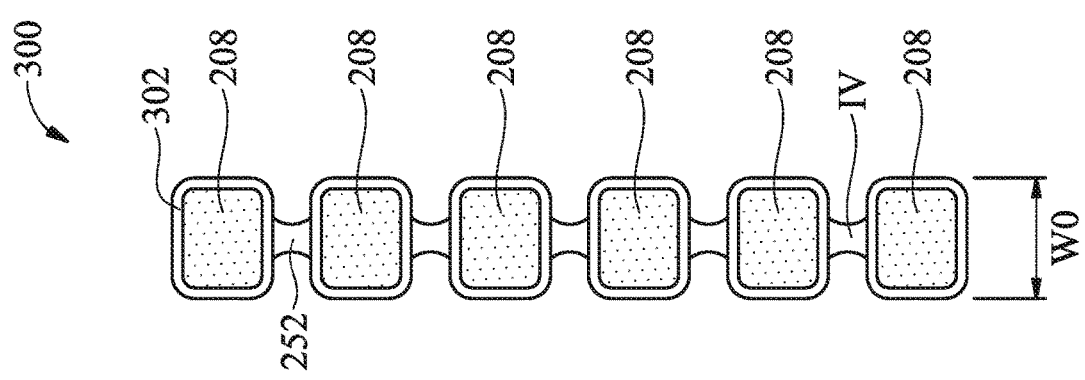

Since the cyclic process includes a nitridation surface treatment and a selective etching towards nitride, the native oxide layer 302 naturally acts as an etching stop layer to protect the nanowires 208 from subsequent cyclic process. Therefore, Step 124 may skip a passivation process as in operation 156 and directly continue to cyclic process of operations 158' and 160' to remove the inner spacer material layer 252 stacked between adjacent nanowires 208, as shown in FIGS. 17 and 18. Many aspects of operation 158' are the same as or similar to those of operation 152', which are not repeated below in interest of conciseness. Also, many aspects of operation 160' are the same as or similar to those of operation 154', which are not repeated below in interest of conciseness. However, since the native oxide layer 302 is usually very thin, step 124 may proceed with operation 158' that is weaker than operation 152', such as lower chemical etchant dose in operation 158' to avoid destroying the native oxide layer 302. For example, HF and $NH_3$ flow rate may be reduced in half in operation 158'. Besides the flow rate reduction, operation 158' may reduce remote plasma (RPS) power or reduce pressure as other methods to weaken the surface treatment and etching. With a smaller RPS power, fewer radicals are generated, which lowers treatment efficiency. The lower pressure can be achieved by enhancing pumping (e.g. larger open angle of valve), which leads to reduced chemical etchants adsorption on wafer, and thus a weaken etching rate. Consequently, one cycle of operations 158' and 160' may remove a thinner layer (e.g., 0.5 nm) than a cycle of operations 152' and 154' (e.g., 1 nm) after the etchant is tuned weaker. Step 124 may further include a cleaning process after the cyclic process to remove the native oxide layer 302 from the nanowires 208.

Figure 19B:
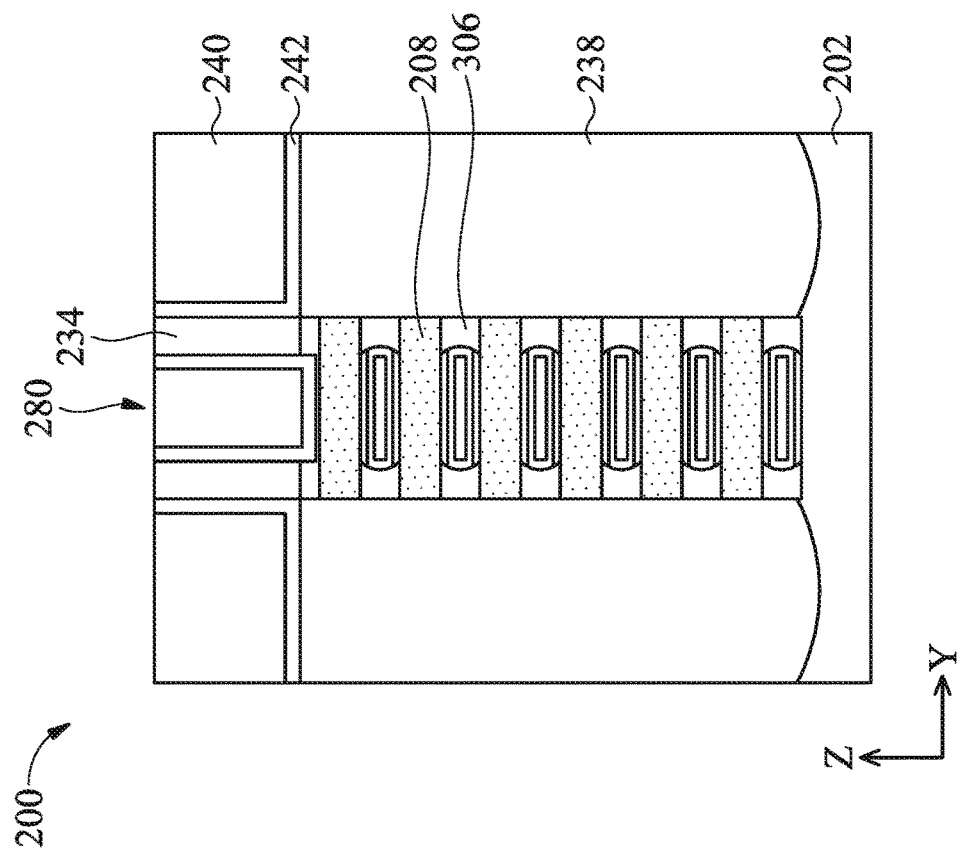

After removing the inner spacer material layer 252 from the channel region, gaps 248 reappear between the adjacent nanowires 208. A portion of the inner spacer material layer 252 directly under the outer spacer 234 and abutting the epitaxial S/D features 238 remains remain as inner spacer features, denoted as inner spacers 306 (FIG. 19B). As will be shown in further details below, a high-K metal gate (HK MG) is to form in the gaps 248, abutting the inner spacers 306. The inner spacers 306 therefore provides isolation between the HK MG and the epitaxial S/D features 238.

Figure 19A:
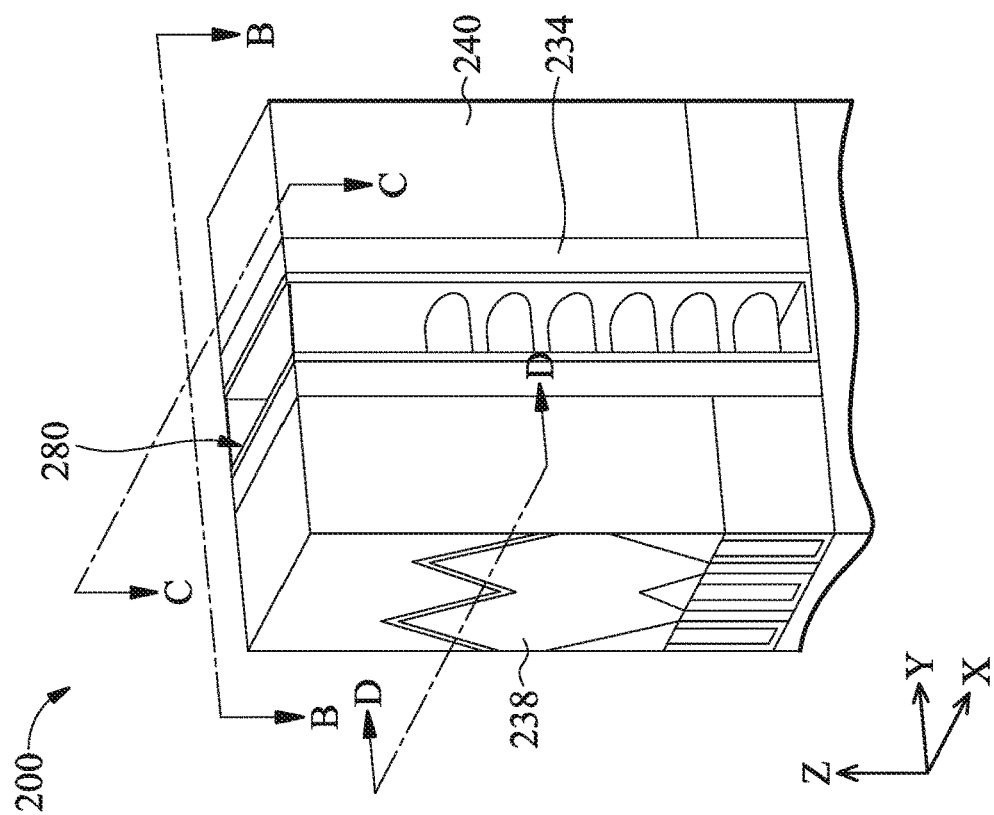
Figure 19C:
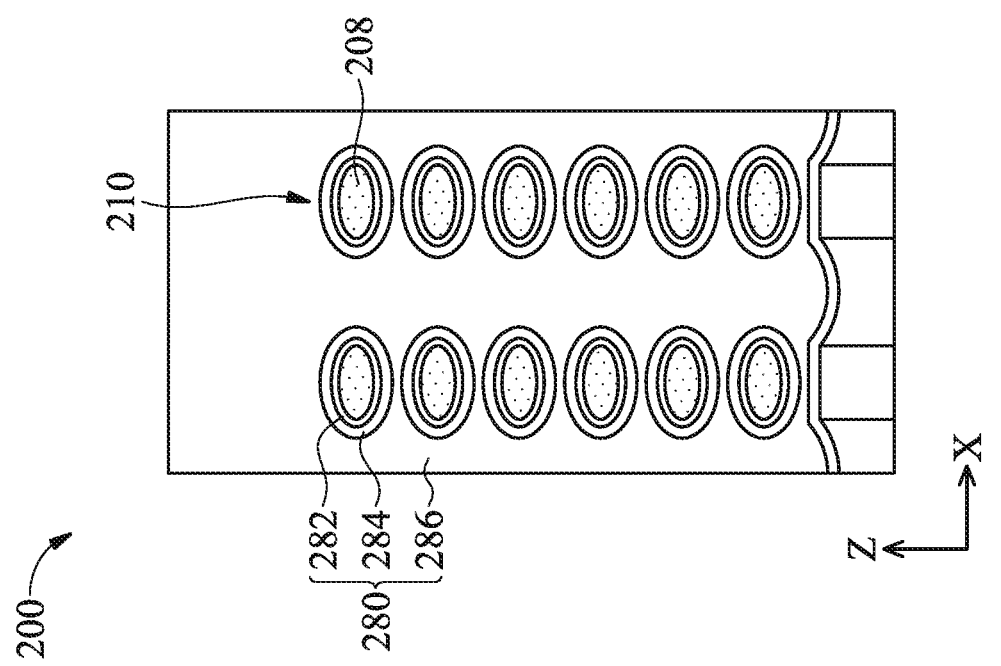

The method 100 proceeds to step 126 (FIG. 1B) where a gate structure is formed. The resultant structure is shown in FIGS. 19A-19C, which are perspective view and cross-sectional views along the B-B, and C-C lines of the device 200, respectively. The gate structure may be the gate of a multi-gate transistor. The gate structure may be a high-K/metal gate (HK MG) stack, however other compositions are possible. In some embodiments, the gate structure forms the gate associated with the multi-channels provided by the plurality of nanowires (now having gaps therebetween) in the channel region.

In an embodiment of step 126, a HK MG stack 280 is formed within the trench of the device 200 provided by the removal of the inner spacer material layer 252 from the channel region and the release of nanowires 208, described above with reference to prior step 124. In various embodiments, the HK MG stack 280 includes an interfacial layer 282, a high-K gate dielectric layer 284 formed over the interfacial layer, and/or a gate electrode layer 286 formed over the high-K gate dielectric layer 284. High-K gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 200. Interposing the HK MG stack 280 and the epitaxial S/D features 238 are the inner spacers 306, providing isolation.

In some embodiments, the interfacial layer 282 of the HK MG stack 280 may include a dielectric material such as silicon oxide ($SiO_2$), HfSiO, or silicon oxynitride (SiON). The interfacial layer 282 may be formed by chemical oxidation, thermal oxidation, atomic layer deposition (ALD), chemical vapor deposition (CVD), and/or other suitable method. The high-K gate dielectric layer 284 of the high-K/metal gate stack 280 may include a high-K dielectric layer 284 such as hafnium oxide ($HfO_2$). Alternatively, the high-K gate dielectric layer 284 of the gate stack 280 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-K gate dielectric layer 284 may be formed by ALD, physical vapor deposition (PVD), CVD, oxidation, and/or other suitable methods.

The gate electrode layer 286 of the HK MG stack 280 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer 286 of HK MG stack 280 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer 284 of the HK MG stack 280 may be formed by ALD, PVD, CVD, e-beam evaporation, or other suitable process. Further, the gate electrode layer 284 may be formed separately for N-FET and P-FET transistors which may use different metal layers (e.g., for providing an N-type or P-type work function). In various embodiments, a CMP process may be performed to remove excessive metal from the gate electrode layer 284 of the HK MG stack 280, and thereby provide a substantially planar top surface of the HK MG stack 280. The HK MG stack 280 includes portions that interpose each of nanowires 208, which form channels of the multi-gate device 200.

The semiconductor device 200 may undergo further processing to form various features and regions known in the art. For example, subsequent processing may form contact openings, contact metal, as well as various contacts/vias/lines and multilayers interconnect features (e.g., metal layers and interlayer dielectrics) on the substrate 202, configured to connect the various features to form a functional circuit that may include one or more multi-gate devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 100, and some process steps described above may be replaced or eliminated in accordance with various embodiments of the method 100.

Although not intended to be limiting, one or more embodiments of the present disclosure provide many benefits to a semiconductor device and the formation thereof. For example, embodiments of the present disclosure provide an inner spacer formation method with accurate etching control. A cyclic process alternating between a surface treatment process and a selectively etching process is performed to etch the inner spacer material layer. Compared with other methods that etch the inner spacer layer in a single etching cycle, the cyclic process maintains integrity of the nanowire, avoids excess etching, and improves precision of CD control. Furthermore, the inner spacer formation method can be easily integrated into existing semiconductor fabrication processes.

In one exemplary aspect, the present disclosure is directed to a method. The method includes a method. The method includes forming a structure including multiple nanowires vertically stacked above a substrate; depositing a dielectric material layer wrapping around the nanowires; performing a treatment process to a surface portion of the dielectric material layer; selectively etching the surface portion of the dielectric material layer; repeating the steps of performing the treatment process and selectively etching until the nanowires are partially exposed; and forming a gate structure engaging the nanowires. In some embodiments, the method further includes after the nanowires are partially exposed, performing a passivation process to the nanowires. In some embodiments, the passivation process also passivates a portion of the dielectric material layer stacked between adjacent nanowires. In some embodiments, the passivation process is a nitridation process. In some embodiments, after the nanowires are partially exposed, a portion of the dielectric material layer remains between adjacent nanowires, the method further includes repeating the steps of performing the treatment process and selectively etching until the portion of the dielectric material layer is removed. In some embodiments, performing the treatment process includes applying a chemical with a first dose before the nanowires are partially exposed and a second dose after the nanowires are partially exposed, and the first dose is higher than the second dose. In some embodiments, the chemical includes ammonia. In some embodiments, the treatment process is an oxidation process. In some embodiments, the treatment process is a nitridation process. In some embodiments, the treatment process includes applying a first temperature for a surface treatment, the selectively etching includes applying a second temperature for etching and subsequently a third temperature for byproduct decomposition, and the second temperature is lower than the third temperature and the third temperature is lower than the first temperature.

In another exemplary aspect, the present disclosure is directed to a method. The method includes a method. The method includes forming a fin protruding from a substrate, the fin having a plurality of sacrificial layers and a plurality of channel layers, wherein the sacrificial layers and the channel layers are alternately arranged; removing a portion of the sacrificial layers to expose the channel layers; depositing a spacer material in areas from which the portion of the sacrificial layers have been removed; performing a surface treatment to the spacer material in a channel region of the fin; selectively etching a portion of the spacer material that receives the surface treatment, thereby reducing a thickness of the spacer material in the channel region; repeating the steps of performing the surface treatment and selectively etching until sidewalls of the plurality of channel layers are exposed, wherein another portion of the spacer material remains between adjacent channel layers in the channel region; repeating the steps of performing the surface treatment and selectively etching until the another portion of the spacer material between adjacent channel layers in the channel region is removed; and forming a gate structure engaging the channel layers. In some embodiments, the method further includes after the sidewalls of the plurality of channel layers are exposed, performing a passivation treatment to the plurality of channel layers. In some embodiments, the surface treatment includes an oxidation process and the passivation treatment includes a nitridation process.

In some embodiments, the surface treatment includes a nitridation process. In some embodiments, performing the surface treatment includes lowering a chemical dose in the surface treatment after the plurality of channel layers is partially exposed. In some embodiments, performing the surface treatment and selectively etching are in-situ. In some embodiments, the method further includes forming a source/drain (S/D) feature, wherein after the another portion of the spacer material remained between adjacent channel layers in the channel region is removed, part of the spacer material remains as a spacer feature, the spacer feature interposing between the S/D feature and the gate structure.

In yet another exemplary aspect, the present disclosure is directed to a method. The method includes forming a fin including a first silicon layer, a second silicon layer, and a silicon germanium (SiGe) layer interposing between the first and second silicon layers; forming a dummy gate structure over a channel region of the fin; forming an outer spacer adjacent the dummy gate structure; epitaxially growing a source/drain (S/D) feature interfacing the first silicon layer, the second silicon layer, and the SiGe layer; removing the dummy gate structure; removing a portion of the SiGe layer to expose the first and second silicon layers in the channel region and in an area directly below the outer spacer; forming a dielectric layer wrapping around the first and second silicon layers; removing a first portion of the dielectric layer to partially expose the first and second silicon layers in the channel region; after the removing of the first portion of the dielectric layer, performing a passivation treatment to the exposed first and second silicon layers; after the performing of the passivation treatment, removing a second portion of the dielectric layer to provide an opening between the first and second silicon layers in the channel region, wherein a third portion of the dielectric layer remains as an inner spacer feature; and forming a gate structure in the opening between the first and second silicon layers in the channel region, wherein the inner spacer feature interposes between the S/D feature and the gate structure. In some embodiments, the dielectric layer is an oxygen containing layer and the removing of the first and second portion of the dielectric layer includes an oxidation treatment with plasma. In some embodiments, the removing of the first and second portion of the dielectric layer includes a cyclic process alternating between a surface treatment and a selective etching.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a structure including multiple nanowires vertically stacked above a substrate;
   depositing a dielectric material layer wrapping around the nanowires;
   performing a treatment process to a surface portion of the dielectric material layer;
   selectively etching the surface portion of the dielectric material layer;
   repeating the steps of performing the treatment process and selectively etching until the nanowires are partially exposed, wherein before the nanowires are partially exposed the dielectric material layer protects the nanowires from receiving the treatment process; and
   forming a gate structure engaging the nanowires.

2. The method of claim 1, further comprising:
   after the nanowires are partially exposed, performing a passivation process to the nanowires.

3. The method of claim 2, wherein the passivation process also passivates a portion of the dielectric material layer stacked between adjacent nanowires.

4. The method of claim 2, wherein the passivation process is a nitridation process.

5. The method of claim 1, wherein after the nanowires are partially exposed, a portion of the dielectric material layer remains between adjacent nanowires, further comprising:
   repeating the steps of performing the treatment process and selectively etching until the portion of the dielectric material layer is removed.

6. The method of claim 5, wherein performing the treatment process includes applying a chemical with a first dose before the nanowires are partially exposed and a second dose after the nanowires are partially exposed, and wherein the first dose is higher than the second dose.

7. The method of claim 6, wherein the chemical includes ammonia.

8. The method of claim 1, wherein the treatment process is an oxidation process.

9. The method of claim 1, wherein the treatment process is a nitridation process.

10. The method of claim 1, wherein the treatment process includes applying a first temperature for a surface treatment, the selectively etching includes applying a second temperature for etching and subsequently a third temperature for byproduct decomposition, and the second temperature is lower than the third temperature and the third temperature is lower than the first temperature.

11. A method, comprising:
    forming a fin protruding from a substrate, the fin having a plurality of sacrificial layers and a plurality of channel layers, wherein the sacrificial layers and the channel layers are alternately arranged;
    removing the sacrificial layers to expose the channel layers;
    depositing a spacer material in areas from which the sacrificial layers have been removed, such that the spacer material fully wraps around the channel layers in a channel region of the fin;
    performing a surface treatment to a surface portion of the spacer material that is exposed in the channel region of the fin;
    selectively etching the surface portion of the spacer material that receives the surface treatment, thereby reducing a thickness of the spacer material in the channel region;
    while sidewalls of the channel layers remain unexposed in the channel region, repeating the steps of performing the surface treatment and selectively etching until at least a portion of the sidewalls of the channel layers are exposed, wherein a portion of the spacer material remains between the adjacent channel layers in the channel region;

repeating the steps of performing the surface treatment and selectively etching until the portion of the spacer material between adjacent channel layers in the channel region is removed; and forming a gate structure engaging the channel layers.

12. The method of claim 11, further comprising:

after the portion of the sidewalls of the channel layers are exposed, performing a passivation treatment to the channel layers.

13. The method of claim 12, wherein the surface treatment includes an oxidation process and the passivation treatment includes a nitridation process.

14. The method of claim 11, wherein the surface treatment includes a nitridation process.

15. The method of claim 14, wherein performing the surface treatment includes lowering a chemical dose in the surface treatment after the plurality of channel layers is partially exposed.

16. The method of claim 11, wherein performing the surface treatment and selectively etching are in-situ.

17. The method of claim 11, further comprising:

forming a source/drain (S/D) feature, wherein after the another portion of the spacer material remained between adjacent channel layers in the channel region is removed, part of the spacer material remains as a spacer feature, the spacer feature interposing between the S/D feature and the gate structure.

18. A method, comprising:

forming a fin including a first silicon layer, a second silicon layer, and a silicon germanium (SiGe) layer interposing between the first and second silicon layers;

forming a dummy gate structure over a channel region of the fin;

forming an outer spacer adjacent the dummy gate structure;

epitaxially growing a source/drain (S/D) feature interfacing the first silicon layer, the second silicon layer, and the SiGe layer;

removing the dummy gate structure;

removing a portion of the SiGe layer to expose the first and second silicon layers in the channel region and in an area directly below the outer spacer;

forming a dielectric layer wrapping around the first and second silicon layers;

removing a first portion of the dielectric layer to partially expose the first and second silicon layers in the channel region;

after the removing of the first portion of the dielectric layer, performing a passivation treatment to the exposed first and second silicon layers;

after the performing of the passivation treatment, removing a second portion of the dielectric layer to provide an opening between the first and second silicon layers in the channel region, wherein a third portion of the dielectric layer remains as an inner spacer feature; and forming a gate structure in the opening between the first and second silicon layers in the channel region, wherein the inner spacer feature interposes between the S/D feature and the gate structure.

19. The method of claim 18, wherein the dielectric layer is an oxygen containing layer and the removing of the first and second portion of the dielectric layer includes an oxidation treatment with plasma.

20. The method of claim 18, wherein the removing of the first and second portion of the dielectric layer includes a cyclic process alternating between a surface treatment and a selective etching.

* * * * *